United States Patent
Wagner

(10) Patent No.: US 6,169,418 B1
(45) Date of Patent: Jan. 2, 2001

(54) EFFICIENT ROUTING FROM MULTIPLE SOURCES TO EMBEDDED DRAM AND OTHER LARGE CIRCUIT BLOCKS

(75) Inventor: Kenneth D. Wagner, Sunnyvale, CA (US)

(73) Assignee: S3 Incorporated, Santa Clara, CA (US)

(*) Notice: Under 35 U.S.C. 154(b), the term of this patent shall be extended for 0 days.

(21) Appl. No.: 09/103,757

(22) Filed: Jun. 24, 1998

(51) Int. Cl.[7] .................. H03K 19/177; H01L 25/00; G11C 5/06
(52) U.S. Cl. ...................... 326/41; 326/41; 326/39; 326/40; 326/101; 327/565; 365/63
(58) Field of Search ................. 327/565; 365/63; 326/39, 40, 41, 101

(56) References Cited

U.S. PATENT DOCUMENTS

| | | | |
|---|---|---|---|
| 5,504,440 | * 4/1996 | Sasaki | 326/41 |
| 5,656,953 | * 8/1997 | Whetsel | 326/38 |
| 5,742,179 | * 4/1998 | Sasaki | 326/41 |
| 5,867,037 | * 2/1999 | Capps, Jr. et al. | 326/39 |
| 5,894,228 | * 4/1999 | Reddy et al. | 326/39 |

* cited by examiner

Primary Examiner—Michael Tokar
Assistant Examiner—Vibol Tan
(74) Attorney, Agent, or Firm—Fenwick & West LLP

(57) ABSTRACT

An improved routing system and method allow routing of pluralities of signals to circuit blocks on integrated circuit chips using minimal die area. The improved routing system employs a plurality of tri-state buffers, a plurality of conductive lines, and a controller. The circuit block can be driven from remote locations via the tri-state buffers and conductive lines. The tri-state buffers are selectively enabled one at a time by the controller to prevent signal contention. The multiplexors encountered in conventional routing systems are not needed. The improved routing system and method are ideal for routing to and from large circuit blocks which have numerous terminals, such as embedded dynamic random access memory units, embedded static random access memory units, central processing units, arithmetic logic units, register files, and cores generally. The improved routing system and method also allow testing of large circuit blocks with test vectors supplied by built in self test units and or off-chip test equipment.

33 Claims, 11 Drawing Sheets

US 6,169,418 B1

EFFICIENT ROUTING FROM MULTIPLE SOURCES TO EMBEDDED DRAM AND OTHER LARGE CIRCUIT BLOCKS

BACKGROUND OF THE INVENTION

1. Field of the Invention

The present invention pertains to a system and method for routing signals between a plurality of devices and one or more circuit blocks on an integrated circuit (IC) chip using minimal space on the IC chip.

2. Description of the Related Art

IC chips frequently contain one or more circuit blocks which must be suitably coupled to a plurality of devices for the IC chip to operate properly. This typically is accomplished using pluralities of conductive lines. Because these conductive lines require space on the IC chip, the circuit blocks and devices are spaced apart from one another on the IC chip, and the conductive lines are routed through the spaces between the circuit blocks and devices.

In many instances, multiple layers of conductive lines suitably insulated from one another can be fabricated over circuitry to achieve sufficient routing space. For example, such conductive lines can be formed from one or more layers of metal or polysilicon, with the various layers being insulated from one another using one or more layers of silicon dioxide. Complex IC chips frequently have four or more layers of these conductive lines. However, very little or no additional routing can occur over some types of circuit blocks due to noise issues or because space over the circuit block must be fully reserved for the circuit block itself. This makes routing signals to the circuit block difficult because there is much congestion or blockage in its vicinity.

Referring now to FIG. 1, there is shown a block diagram illustrating a conventional system 100 for interconnecting several electrical devices on an IC chip 90 to a single terminal 51 of a circuit block 50 on the IC chip 90. These electrical devices include pads 10, 60, a logic block 20, and a built in self test (BIST) unit 30. The IC chip 90 also includes a multiplexor 40 and a plurality of conductive lines 14, 24, 34, 44, 22, and 62. Pad 10 is coupled by conductive line 14 to a first data input of the multiplexor 40, the logic block 20 is coupled by conductive line 22 to a second data input of the multiplexor 40, and the BIST unit 30 is coupled by conductive line 34 to a third data input of the multiplexor 40. The logic block 20 is further coupled by conductive line 24 to a first selection input of the multiplexor 40, and pad 60 is coupled by conductive line 62 to a second selection input of the multiplexor 40. The output of the multiplexer 40 is coupled to terminal 51 of the circuit block 50.

In operation, the logic block 20 and pad 60 supply control signals to the election inputs of the multiplexor 40. If the first data input is selected, then signals from the pad 10 will be asserted by the output of the multiplexor 40 via conductive line 44 onto terminal 51 of the circuit block 50. Similarly, if the third data input is selected, then the signal from the BIST unit 30 will be asserted by the output of the multiplexor 40 via conductive line 44 onto the terminal 51 of the circuit block 50.

Conventional system 100 is limited. Each of these lines 14, 24, 34 occupies space on the IC chip 90 which reduces the amount of circuitry which can be fabricated on the IC chip 90. Additional metal layers may be needed to form the various lines 14, 24, 34. Further, two conductive lines 22, 62 are required to provide control signals to the multiplexor 40. These two lines 22, 62 also occupy space on the IC chip 90. To reduce the total length of conductive line employed in routing the circuit block 50, the multiplexor 40 typically is located in the vicinity of the circuit block 50. However, this also increases routing congestion in the vicinity of the circuit block 50. Conventional system 100 thus requires significant space on the IC chip 90 to implement, and performs increasingly poorly as the number of terminals of circuit block 50 is increased. Further, the paths shown in FIG. 1 are unidirectional, and circuit block 50 cannot therefore supply signals to the pad 10, logic block 20, and BIST unit 30 in conventional system 100.

Referring now also to FIG. 2 there is shown a block diagram illustrating a second conventional system 200 for interconnecting several electrical devices to circuit block 50 on IC chip 90. In conventional system 200, circuit block 50 includes an additional terminal 52 through which the circuit block 50 receives signals from the logic block 20, BIST unit 30, and an additional pad 110. Pad 10, logic block 20 and BIST unit 30 are coupled by lines 14, 24, 134, multiplexor 40, and conductive line 44 to terminal 51 of circuit block 50 as in conventional system 100. Additional pad 110 is coupled by a first additional conductive line 114 to a first data input of an additional multiplexor 140. The logic block 20 is further coupled by a second additional conductive line 26 to a second data input of the multiplexor 140. The BIST unit 30 is coupled by a third additional conductive line 36 to a third data input of the multiplexor 140. The multiplexor 140 also has selection inputs which are coupled to lines 162 and 122 for receiving control signals from pad 60 and logic block 20.

In operation, the logic block 20 and pad 60 supply control signals respectively via lines 122, 162 to the selection inputs of multiplexors 40 and 140. The first data input of each multiplexor 40, 140 is enabled at the same time, and similarly for the second and third data input of each multiplexor 40, 140. If the first data inputs are enabled, then pad 10 communicates via conductive line 14, multiplexor 40, conductive line 44, and terminal 51 with the circuit block 50; and similarly, pad 110 communicates via conductive line 114, multiplexor 140, conductive line 144, and terminal 52 with the circuit block 50. The logic block 20 and BIST unit 30 communicate with the circuit block 50 in similar manner.

Conventional system 200 is highly limited. First, lines 122, 162 require more space on the IC chip 90 to implement than corresponding lines 22, 62 of conventional system 100 because lines 122, 162 provide signals to two different destinations, whereas the corresponding lines 22, 62 each provide signals to a single destination. Due to routing requirements, conductive line 134 is significantly longer than corresponding conductive line 34 of conventional system 100, and hence requires significantly more space on the IC chip 90 to implement. Lines 114, 26, 36 and dual destination lines 122, 162 are occupying portions of the space on the IC chip 90 where conductive line 34 is routed in FIG. 1. Thus, as the number of terminals of the circuit block 50 is increased, the conventional system 200 typically requires much more space to implement. Another significant limitation with conventional system 200 is caused by the additional multiplexor 140. This multiplexor 140 occupies space on the IC chip 90. Like multiplexor 40, multiplexor 140 typically is located in the vicinity of the circuit block 50, which obstructs access to the circuit block 50, and makes routing of the various conductive lines 14, 24, 134, 114, 26, 36, 122, 162 much more space intensive.

These various limitations with conventional system 200 become increasingly significant as the number of terminals of the circuit block 50 is increased. This is a very important problem in current IC chip designs. For example, over the last few years it has become increasingly valuable to include both a large dynamic random access memory (DRAM) unit and a processing unit on the same IC chip. This greatly reduces the time required to obtain information from DRAM compared to locating DRAM and processing units on separate IC chips. However, large DRAM units typically have a very large number of terminals. A two megabyte DRAM unit would typically have 128 data terminals, 17 address terminals, and various control and power supply terminals. Further, it is common for large embedded DRAM units to occupy fifty percent or more of the surface area of the IC chip. Usually the surface area occupied by the DRAM is reserved entirely for the DRAM. That is, conductive lines are not routed over the embedded DRAM. Using the conventional system 200 to couple an embedded DRAM to other devices would then consume a significant amount of the remaining space on the IC chip, increase access time to the DRAM unit due both to capacitive delays and to delays in the various multiplexors required, and thus significantly degrade performance of the IC chip 90.

There is thus a continuing need in the field of integrated circuit electronics for an improved routing system and method for routing signals between a plurality of devices and a circuit block or circuit blocks on an IC chip. There is also a continuing need for such improved system to occupy minimal space on the IC chip. There is further a need in such improved system and method to prevent signal contention between various signal sources.

SUMMARY OF THE INVENTION

According to the present invention, an improved routing system and method are provided for routing pluralities of signals to one or more circuit blocks on an integrated circuit (IC) chip. The improved routing system and method beneficially avoid contention between such signals, and may further be implemented to support initialization and scanning of the IC chip.

In accordance with one aspect of the present invention, the improved system includes a plurality of tri-state buffers (TSB) and a controller. The tri-state buffers drive a common terminal on the circuit block and the controller enables one of the tri-state buffers at a time to prevent contention between signals from the tri-state buffers.

In accordance with another aspect of the present invention, a tri-state buffer includes an input terminal, an output terminal, and an enabling terminal. The enabling terminal is used to selectively enable the tri-state buffer. When enabled, signals asserted on the input terminal are transmitted through to the output terminal. When disabled, the tri-state buffer supplies a high impedance between the input terminal and the output terminal. This allows the voltage level at the output terminal to float substantially to any voltage level that is received at the output terminal from another tri-state buffer or other device.

In accordance with another aspect of the present invention, to couple a plurality of devices to the same terminal of a circuit block, a tri-state buffer is coupled between each device and the terminal. A signal asserted by one of the devices will then be transmitted via the tri-state buffer coupled thereto to the terminal of the circuit block if such tri-state buffer is enabled. Preferably, one of the tri-state buffers is enabled at a time so that the terminal will receive signals from one of the devices at a time. The improved routing system thus prevents contention between signals from the devices.

In accordance with another aspect of the present invention, each tri-state buffer is preferably located in the vicinity of the device which supplies signals to it. The tri-state buffers need not be located near the circuit block, which helps to save routing space near the circuit block, and thus decreases obstructions to the terminal or terminals of the circuit block. These properties are believed to save substantial space on the IC chip, and also to simplify routing of lines or buses to terminals of the circuit block.

In accordance with another aspect of the present invention, some embodiments of the improved routing system beneficially include a bus coupled to receive signals from and supply signals to circuit blocks. The bus may comprise a single conductive line, but more typically comprises a plurality of conductive lines arranged in parallel with one another. A portion of the bus typically is located along the perimeter of the circuit block to reduce routing congestion. Each conductive line of the bus may be coupled to one or more terminals of the circuit block, and is enabled by one tri-state buffer at a time. This allows the conductive line, and hence the terminals, to be driven by a plurality of devices on the IC chip without encountering signal contention. These features of the present invention reduce routing congestion in the vicinity of the circuit block, which helps to reduce the length of the conductive lines, and eliminates the multiplexors encountered in conventional routing systems.

In accordance with another aspect of the present invention, one of the tri-state buffers is enabled and the other tri-state buffers are disabled at a time. This allows the enabled tri-state buffer, and hence the device coupled to the input thereof, to supply signals to a terminal of the circuit block, while preventing the other tri-state buffers from supplying signals to the terminal. Further, in accordance with another aspect of the present invention, all of the tri-state buffers may be disabled at the same time to support initialization and scanning of the IC chip. This may further include holding logic states on a terminal, bus, or other node, for example, by means of a bus hold cell.

The present invention thus provides an improved routing system and method for routing pluralities of signals to one or more circuit blocks on an IC chip and for avoiding contention between such signals. The present invention substantially reduces the length of conductive lines used for routing a circuit block, which saves space on the IC chip. Routing difficulties are also avoided by the present invention because there is no need to route around the multiplexors encountered in conventional routing systems. The improved routing system and method of the present invention can beneficially route large circuit blocks having large numbers of terminals which may receive signals from numerous devices. This makes the improved routing system and method particularly beneficial for routing embedded DRAMs.

DETAILED DESCRIPTION OF THE PREFERRED EMBODIMENTS

The present invention comprises an improved routing system and method for routing pluralities of signals to one or more circuit blocks on an integrated circuit (IC) chip, and for avoiding contention between such signals. The present invention is particularly beneficial for routing large circuit blocks such as embedded DRAM units, but can also be beneficially applied to various circuit blocks including embedded static random access memory (SRAM) units, central processing units (CPUs), arithmetic logic units (ALUs), register files, and cores generally.

Figure 1:
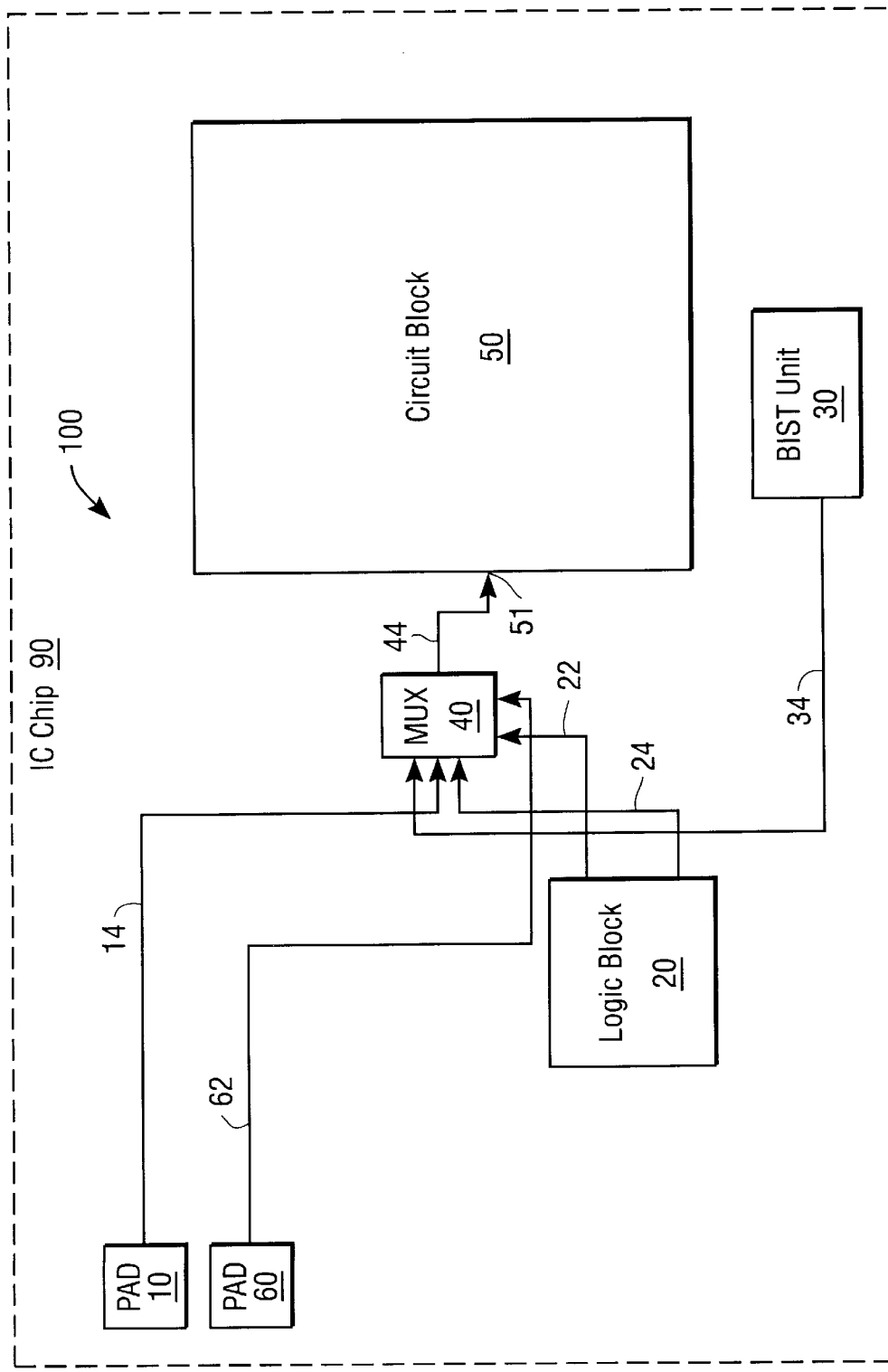
FIG. 1 is a block diagram illustrating a conventional system for interconnecting several electrical devices to a single terminal of a circuit block located on an IC chip.
Figure 2:
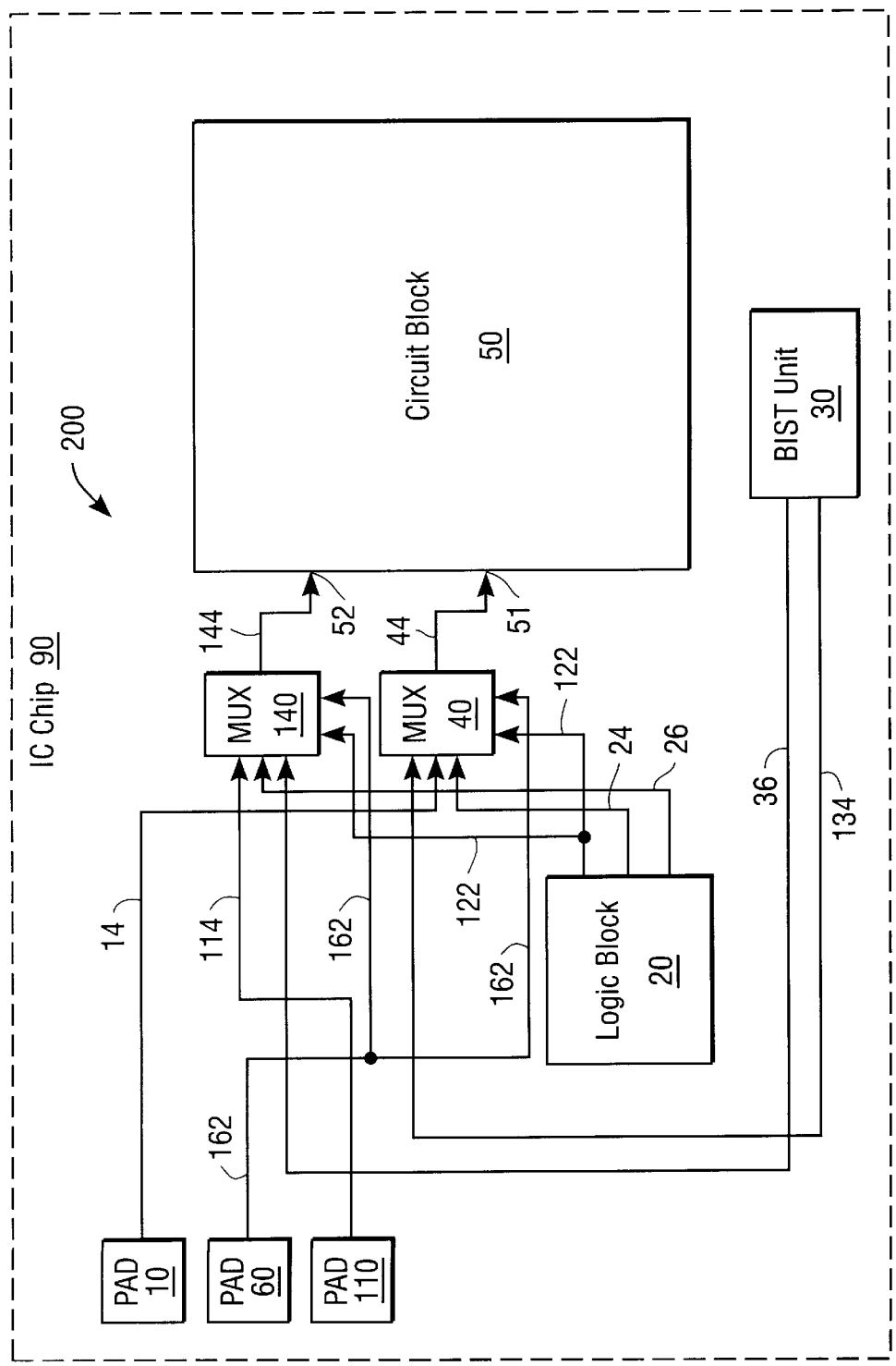
FIG. 2 is a block diagram illustrating a second conventional system for interconnecting several electrical devices to more than one terminal of a circuit block located on an IC chip.
Figure 3A:
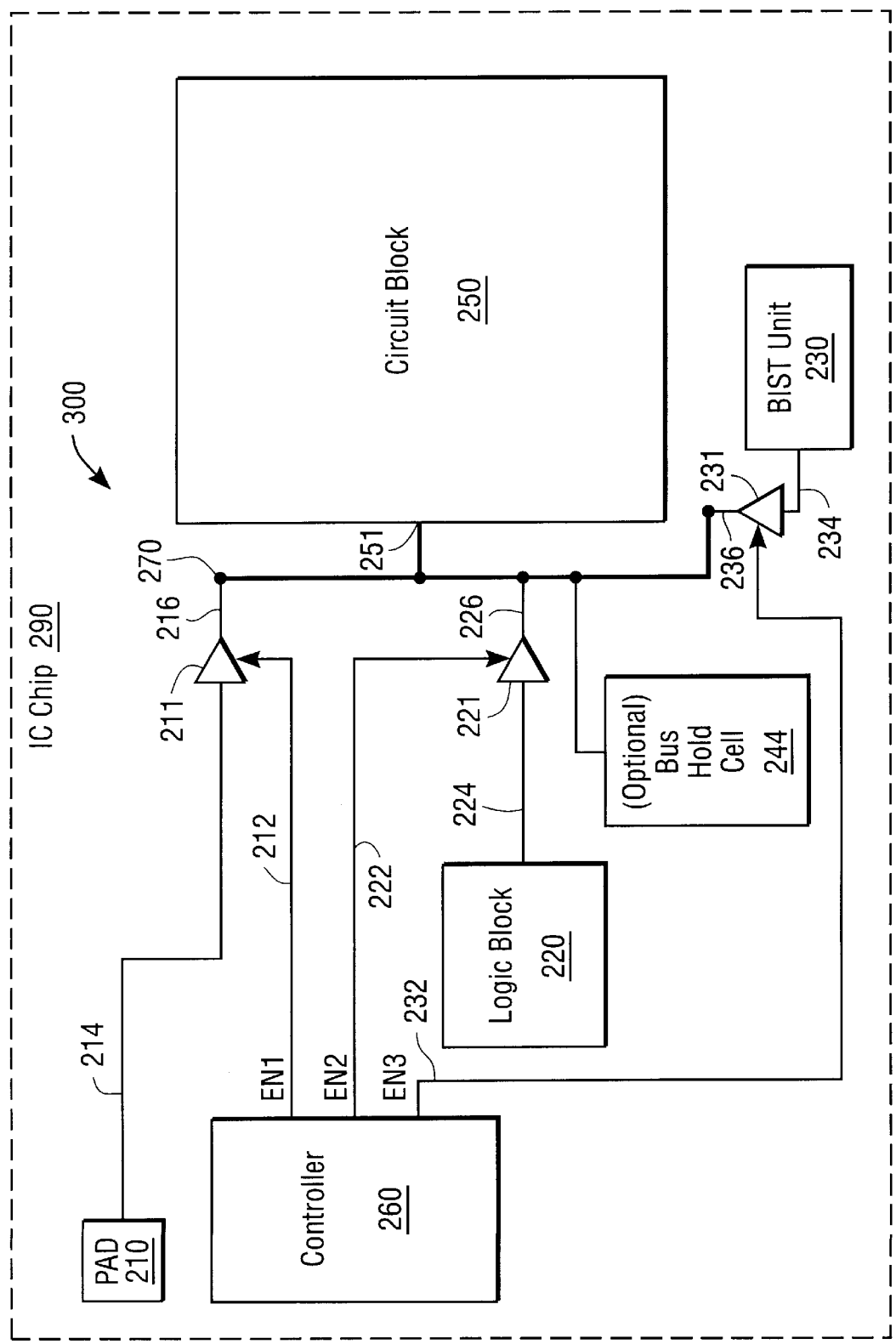
FIG. 3A is a block diagram illustrating a first embodiment of an improved routing system, in accordance with the present invention, for interconnecting several electrical devices to a one-bit wide terminal of a circuit block located on an IC chip.

Referring now to FIG. 3A there is shown a block diagram illustrating a first embodiment of the improved routing system 300 for coupling several electrical devices to a terminal 251 of a circuit block 250 of an IC chip 290 in accordance with the present invention. The IC chip 290 includes a pad 210, a logic block 220, a built in self test (BIST) unit 230, and the circuit block 250. For example, the logic block 220 may be a conventional processing unit, the circuit block 250 may be a large embedded dynamic random accesses memory (DRAM) unit, and BIST unit 230 may be of conventional design for testing such embedded DRAM unit.

The improved routing system 300 comprises a plurality of tri-state buffers 211, 221, 231, a controller 260, conductive lines 212, 214, 216, 222, 224, 226, 232, 234, 236, and a bus 270. Each tri-state buffer 211, 221, 231 has an input terminal, an output terminal, and an enabling terminal. In this embodiment of the present invention, each of these terminals is one-bit wide. The enabling terminals are used to selectively enable the tri-state buffers 211, 221, 231. When enabled, signals asserted on the input terminal are transmitted through to the output terminal. However, when disabled, each tri-state buffer 211, 221, 231 supplies high impedance between its input terminal and its output terminal. The high impedance allows the voltage level at the output terminal to float substantially to any voltage level that is received at the output terminal from another tri-state buffer or other device.

The controller 260 supplies control signals EN1, EN2, EN3 for selectively enabling the tri-state buffers 211, 221, 231. In this embodiment of the present invention, the HIGH states of control signals EN1, EN2, EN3 enable tri-state buffers 211, 221, 231 respectively, and the LOW states of control signals EN1, EN2, EN3 disable tri-state buffers 211, 221, 231 respectively. The HIGH state of these control signals EN1, EN2, EN3 may comprise a voltage level substantially equal to an operating voltage of the IC chip 290, for example, 3 Volts. The LOW state of these control signals EN1, EN2, EN3 may comprise a ground voltage of the IC chip 290, for example, 0 Volts. In an alternative embodiment of the present invention, LOW states of control signals EN1, EN2, EN3 enable tri-state buffers 211, 221, 231 respectively, and HIGH states of control signals EN1, EN2, EN3 disable tri-state buffers 211, 221, 231 respectively. Various other signals may also be used for enabling and disabling such tri-state buffers such as enabling with LOW states and disabling with HIGH states, in accordance with the present invention.

In this embodiment of the present invention, the conductive lines 212, 214, 216, 222, 224, 226, 232, 234, 236 are one-bit wide, and are formed from a layer or layers of metal or polysilicon. The bus 270 similarly is one-bit wide, and preferably is formed from a layer or layers of metal. The bus 270 traverses at least that edge of circuit block 250 which includes terminal 251. Preferably, the bus 270 also traverses that edge or edges of the circuit block 250 along side of which the pad 210, logic block 220, and or BIST unit 230 are located. In accordance with the present invention, one or more edges of the circuit block 250 can include additional terminals. If so, the bus 270 can be extended along those edges of the circuit block 250 which contain such terminals. This supports interconnection of the terminals to the bus 270 without substantial increase in die area occupied by routing.

The plurality of tri-state buffers 211, 221, 231, controller 260, conductive lines 212, 214, 216, 222, 224, 226, 232, 234, 236, and bus 270 are located on the IC chip 290 as follows. The tri-state buffers 211, 221, 231 are located along a plurality of edges of circuit block 250. In particular, tri-state buffers 211, 221 are located near the left edge of circuit block 250 and tri-state buffer 231 is located near the bottom edge of circuit block 250. A routing channel is provided between the circuit block 250 and the tri-state buffers 211, 221, 231 for routing of interconnection media such as the bus 270 and conductive lines 216, 226, 236. In this embodiment of the present invention, the routing channel is preferably just sufficiently wide to hold the bus 270 and conductive lines 216, 226, 236. In alternative embodiments of the present invention, the routing channel preferably is wide enough to hold other desired interconnection media such as additional buffers to support bi-directional signal flow, additional conductive lines, and additional buses. To reduce die area occupied by routing of the circuit block 250 to the pad 210, logic block 220, and BIST unit 230, the bus 270 and conductive lines 216, 226, 236 preferably are juxtaposed between the tri-state buffers 211, 221, 231 and the circuit block 250. Conductive lines 212, 222, 232 allow the controller 260 to be located away from the tri-state buffers 211, 221, 231. Similarly, conductive lines 214, 224, 234 respectively allow pad 210, logic block 220, and BIST unit 230 to be located away from the tri-state buffers 211, 221, 231. Unlike convention routing systems, these conductive lines 212, 222, 232, 214, 224, 234 typically do not increase routing congestion in the immediate vicinity of the circuit block 250.

The tri-state buffers 211, 221, 231 and controller 260 are coupled with the circuit block 250 as follows. Pad 210 is coupled by conductive line 214 to the input terminal of tri-state buffer 211. The output terminal of tri-state buffer 211 is coupled by conductive line 216 and bus 270 to terminal 251 of the circuit block 250. The controller 260 is coupled by conductive line 212 to supply the control signal EN1 to the enabling terminal of tri-state buffer 211. Similarly, the logic block 220 is coupled by conductive line 224 to the input terminal of tri-state buffer 221. The output terminal of tri-state buffer 221 is coupled by conductive line 226 and bus 270 to terminal 251 of circuit block 250. The controller 260 is coupled by conductive line 222 to supply the control signal EN2 to the enabling terminal of tri-state buffer 221. Similarly, the BIST unit 230 is coupled by conductive line 234 to the input terminal of tri-state buffer 231. The output terminal of tri-state buffer 231 is coupled by conductive line 236 and bus 270 to terminal 251 of circuit block 250. Finally, the controller 260 is coupled by conductive line 232 to supply the control signal EN3 to the enabling terminal of tri-state buffer 231.

An optional bus hold cell 244 can be coupled alternatively to the bus 270 or one or more of conductive lines 216, 226, 236. The bus hold cell 244 holds the bus 270 to its previous logic state in a conventional manner when all of the tri-state buffers 211, 221, 231 are tri-stated and the circuit block 250 is not asserting a signal to the bus 270, such as during scanning. This prevents floating voltages from arising on the bus 270 and thus reduces power consumption. The bus hold cell 244 can comprise a conventional latch coupled to hold the logic state asserted to the bus 270. The latch should be weak enough that the other devices, such as the tri-state buffers 211, 221, 231, can overcome its holding power.

Figure 3B:
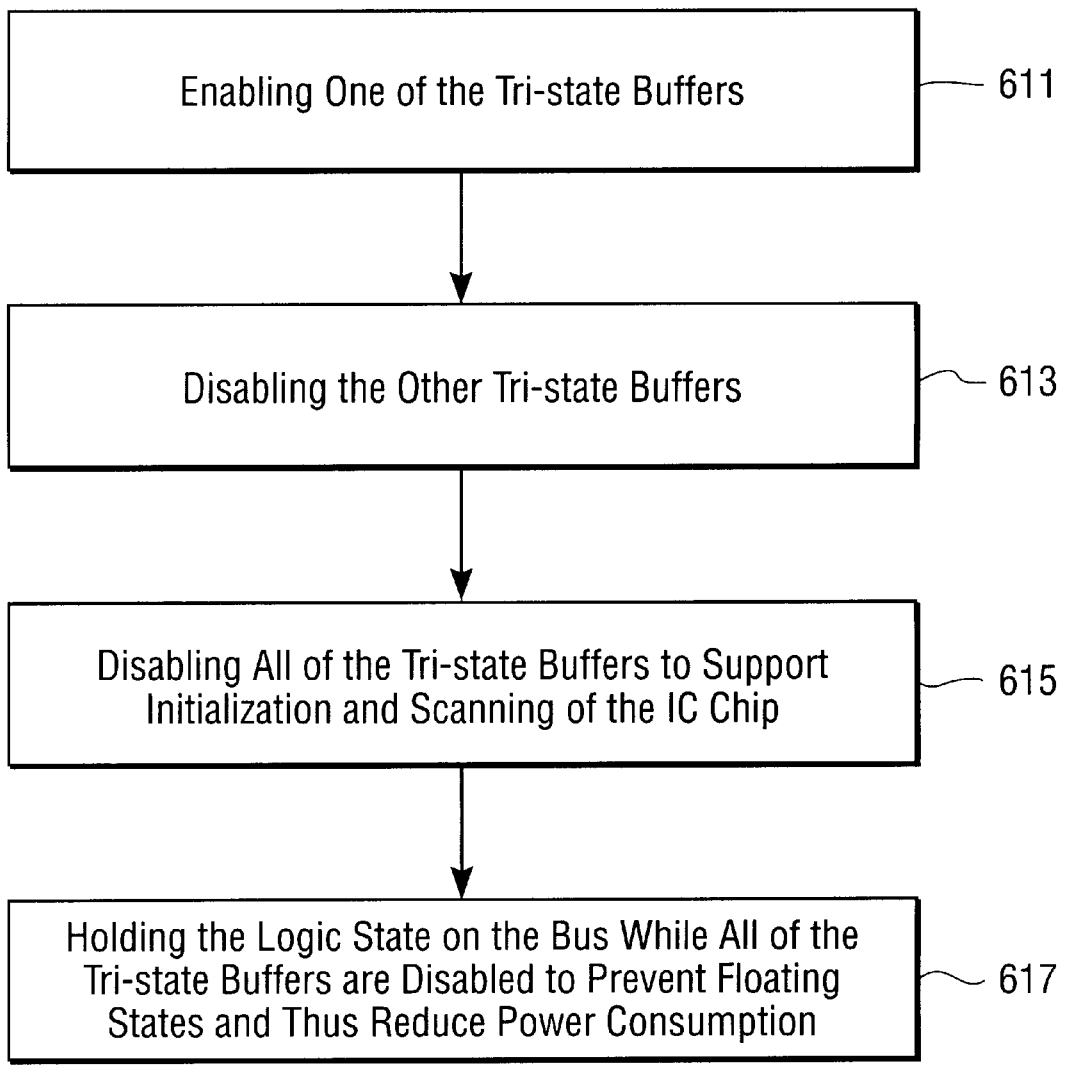
FIG. 3B is a first flow chart illustrating an embodiment of the improved routing method according to the present invention implemented on the first embodiment of the improved routing system.

Referring now to FIG. 3B there is shown a flow chart illustrating an embodiment of the improved routing method according to the present invention implemented on the improved routing system 300. In operation, the controller 260 enables 611 one of the tri-state buffers 211, 221, 231 and disables 613 the others, which allows only one of the devices 210, 220, or 230 to supply signals to terminal 251 of the circuit block 250 at a time. For example, to test the circuit block 250 using external testing equipment, the controller 260 enables tri-state buffer 211, which allows such testing equipment to access terminal 251 of the circuit block 250 via the pad 210. To prevent the logic block 220 and BIST unit 230 from supplying signals to terminal 251 at the same time, the controller 260 disables tri-state buffers 221 and 231 while tri-state buffer 211 is enabled. Similarly, to test the circuit block 250 using the BIST unit 230, the controller 260 enables tri-state buffer 231 and disables tri-state buffers 211 and 221. This allows the BIST unit 230 to access terminal 251 of the circuit block 250 without encountering signal contention from the pad 210 and logic block 220. To allow the logic block 220 to communicate with the circuit block 250 without signal contention from the pad 210 and BIST unit 230, the controller 260 enables tri-state buffer 221 and disables tri-state buffers 211 and 231. Depending on its design, the controller 260 may disable 615 all of the tri-state buffers 211, 221, 231 at the same time. This prevents these tri-state buffers 211, 221, 231 from supplying signals to terminal 251 during scanning and initialization of the IC chip 290. A controller 260 capable of performing step 615 is illustrated in FIG. 3F. Further, the bus hold cell 244 can be included in improved routing system 300 to hold 617 the logic state on the bus 270. This prevents floating voltages from arising on the bus 270 during scanning and initialization, and thus reduces power consumption on the IC chip 290.

Figure 3C:
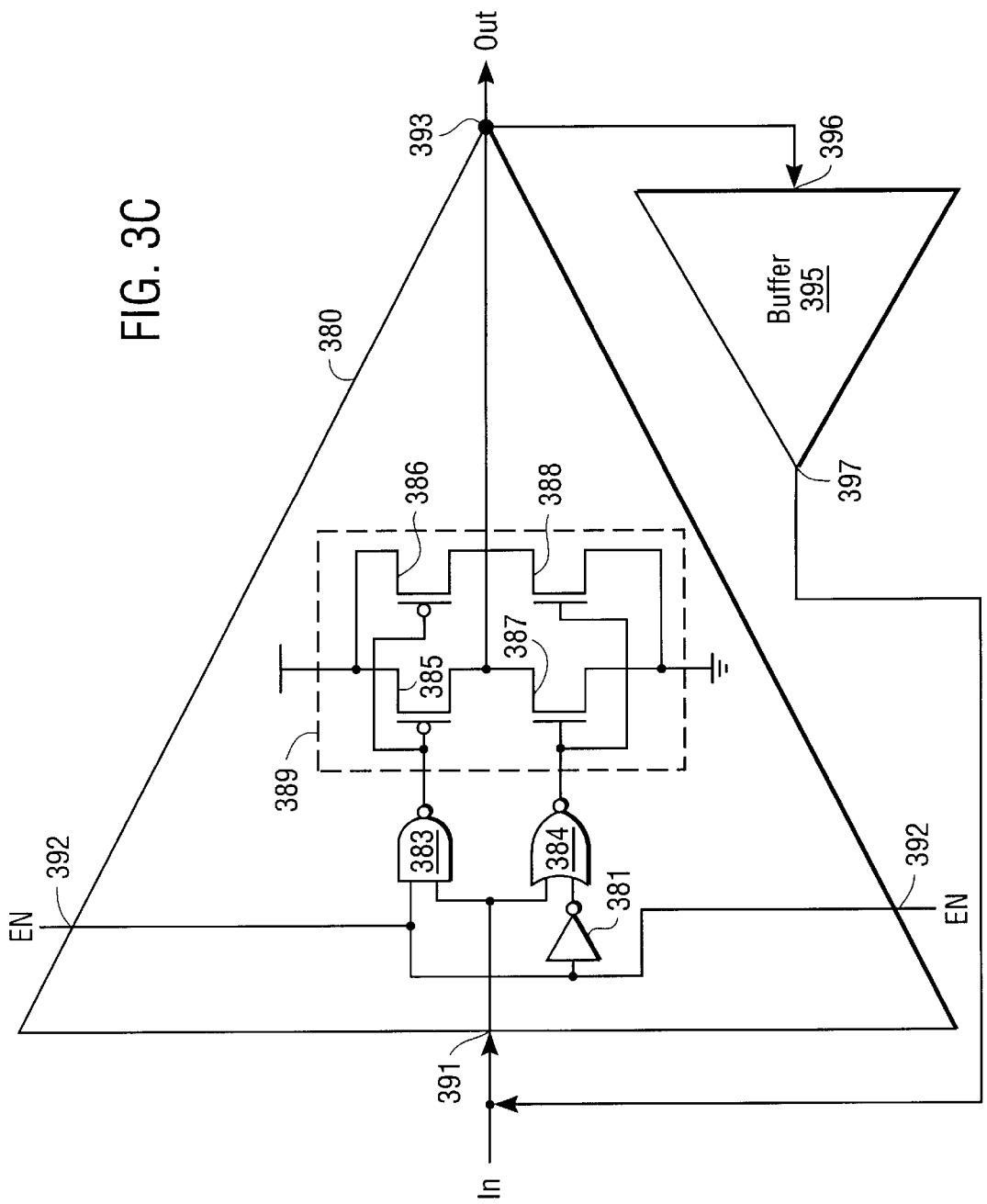
FIG. 3C is a schematic diagram illustrating an embodiment of various tri-state buffers included in the routing system illustrated in FIG. 3A.
Figure 3E:
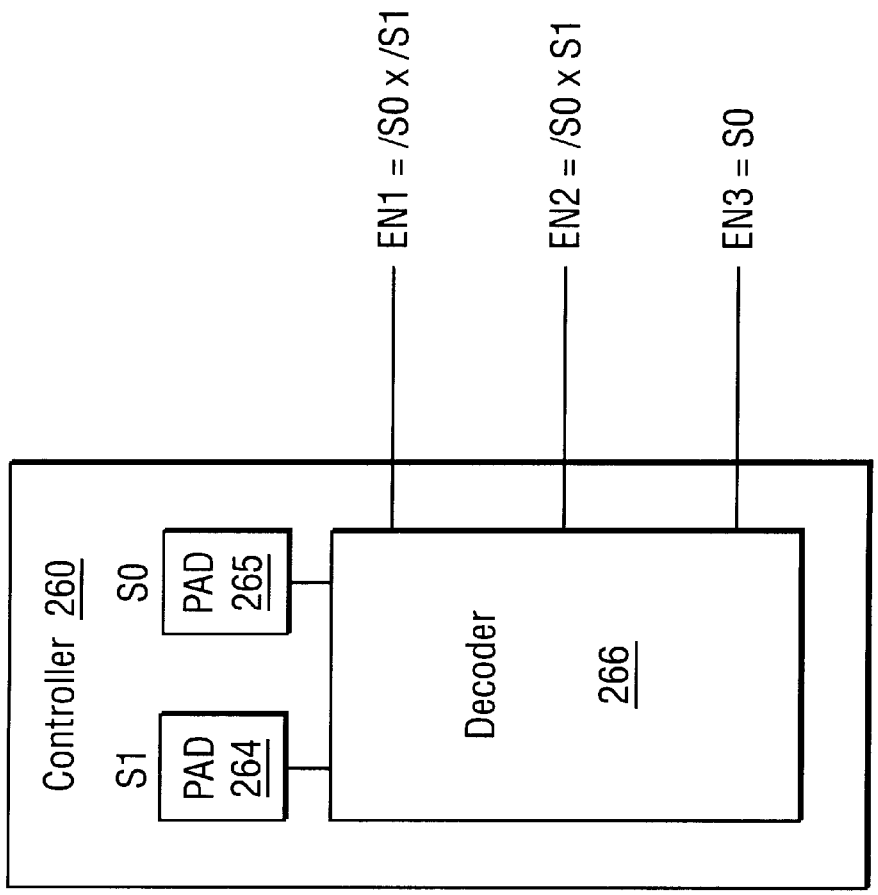
FIG. 3E is a schematic diagram of a second embodiment of a controller in accordance with the present invention which includes a ones-hot decoder.

Referring now also to FIG. 3C there is shown a schematic diagram of an embodiment of a tri-state buffer 380 suitable for use with the present invention, for example, as tri-state buffers 211, 221, and or 231 included in improved routing system 300. Tri-state buffer 380 comprises an inverter 381, a NAND gate 383, a NOR gate 384, p-channel field effect transistors (PFETs) 385, 386, and n-channel field effect transistors (NFETs) 387, 388, and is coupled together as follows. An input terminal 391 of the tri-state buffer 380 is coupled to both the NAND gate 383 and the NOR gate 384. An enabling terminal 392 of tri-state buffer 380 is coupled to the NAND gate 383 and by inverter 381 to the NOR gate 384. The NAND gate 383 is further coupled to the gates of the PFETs 385, 386 and the NOR gate 384 is further coupled to the gates of the NFETs 387, 388. The PFETs 385, 386 are respectively coupled with the NFETs 387, 388 to form a pair of parallel coupled tri-state output drivers 389 which drive the output terminal 393 of tri-state buffer 380.

In operation, the input terminal 391 of tri-state buffer 380 receives an input signal IN and the enabling terminal 392 receives a control signal EN. The LOW state of the control signal EN causes the NAND gate 383 to assert a HIGH state on the gates of the PFETs 385, 386, which turns OFF the PFETs 385, 386. The LOW state of the control signal EN also causes the NOR gate 384 to assert a LOW state on the gates of the NFETs 387, 388, which turns OFF the NFETs 387, 388. The LOW state of the control signal EN thus disables (tri-states) the tri-state buffer 380. The HIGH state of the control signal EN causes the NAND 383 and the NOR gate 384 to assert the inverse /IN of the input signal IN to the gates of the PFETs 385, 386 and the NFETs 387, 388, which in turn causes the pair of tri-state drivers 389 to assert a buffered copy of the input signal IN at the output terminal 393 of the tri-state buffer 380.

Tri-state buffer 380 is unidirectional. That is, signals cannot be transmitted through the tri-state buffer 380 from the output terminal 393 to the input terminal 391. A bi-directional buffer can conveniently be formed by coupling a buffer 395 with the tri-state buffer 380 in the manner illustrated in FIG. 3C. More particularly, the input terminal 396 of the buffer 395 is coupled to the output terminal 393 of tri-state buffer 380, and the output terminal 397 of the buffer 395 is coupled to the input terminal 391 of tri-state buffer 380. The buffer 395 can be formed by serially coupling two inverters. It supplies signals received at the output terminal 393 of tri-state buffer 380 to the input terminal 391 of tri-state buffer 380 regardless of whether or not tri-state buffer 380 is enabled. It is noted that a plurality of such bi-directional buffers can be coupled at their respective output terminals 393 to drive a common circuit node, such as a conductive line, bus, or circuit terminal, without creating signal contention if only one of the tri-state buffers is enabled at a time in accordance with the present invention.

In alternative embodiments of the present invention, multi-bit tri-state buffers may be included in place of or along with the single bit tri-state buffers described above. Such multi-bit tri-state buffers are preferably formed by parallel coupling a plurality of one-bit tri-state buffers, such as tri-state buffer 380, and coupling together the enabling terminals of such tri-state buffers to form a common enabling terminal for the multi-bit tri-state buffer.

Figure 3D:
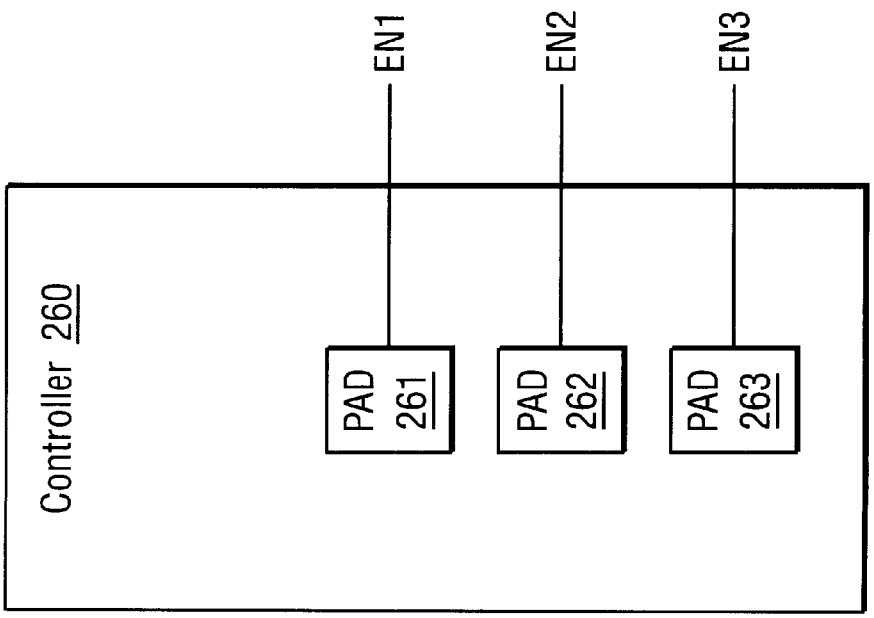
FIG. 3D is a schematic diagram of a first embodiment of a controller in accordance with the present invention.
Figure 3F:
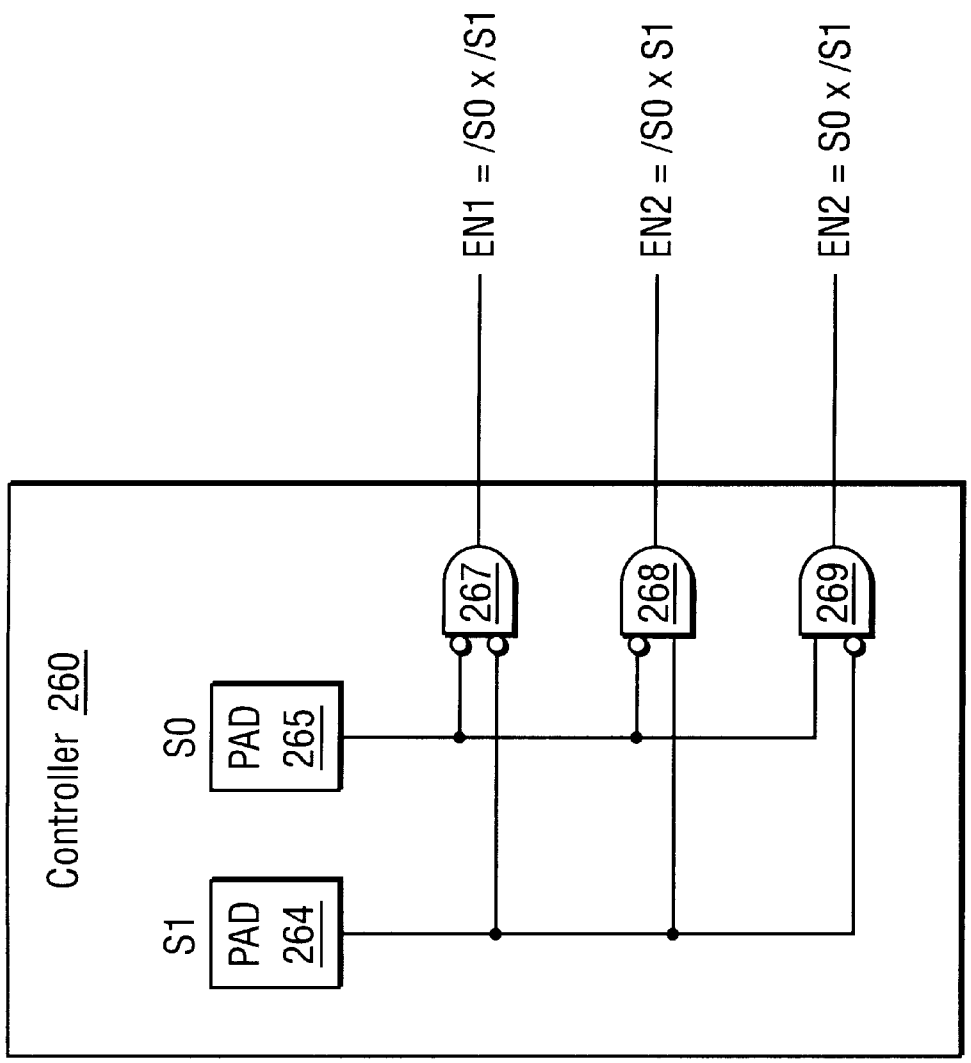
FIG. 3F is a schematic diagram of a third embodiment of a controller in accordance with the present invention which beneficially supports initialization and scanning of circuitry on an integrated circuit chip.

Referring now to FIG. 3D there is shown a first embodiment of the controller 260 comprising a plurality of pads 261, 262, 263 which respectively receive signals EN1, EN2, EN3 from off the IC chip 290 in accordance with the present invention. Manufacturing tests can be performed on circuit block 250 by asserting control signal EN1 at HIGH state to pad 261, and asserting control signals EN2, EN3 at LOW states, respectively to pads 262 and 263. The circuit block 250 can be tested by the BIST unit 230 at manufacture, and at start up, by asserting control signal EN3 at HIGH state to pad 263, and asserting control signals EN1, EN2 at LOW states respectively to pads 261, 262. Finally, the logic block 220 can communicate with the circuit block 250 by asserting control signal EN2 at HIGH state to pad 262, and asserting control signals EN1, EN3 at LOW states respectively to pads 261, 263. It is noted that off-chip testing of IC chips typically is performed at manufacture, and pad 261 would normally be tied to the LOW state of control signal EN1 once the IC chip 290 is incorporated into a final device. Thus, to switch between BIST testing and performance modes of operation of the IC chip 290, the control signals EN2, EN3 respectively on pads 262, 263 are both inverted. Finally, all three control signals EN1, EN2, EN3 can be asserted at LOW states respectively to pads 261, 262, 263 to allow scanning of the BIST unit 230, logic block 220, or other circuitry on the IC chip 290. Such scanning initializes such devices 230, 220 so that they will operate properly, as will be immediately understood by those skilled in the art. During scanning, the bus 270 is held to its previous logic state by the bus hold cell 240.

Referring now also to FIG. 3E, there is shown a second embodiment of controller 260 comprising a plurality of pads 264, 265 coupled to a ones-hot decoder 266 in accordance with the present invention. Control signals S1, S0 from a source off the IC chip are respectively asserted via pads 264, 265 to the ones-hot decoder 266. The ones-hot decoder decodes these control signals S1, S0 according to the relationships EN1=/S0×/S1, EN2=/S0×S1, EN3=S0, and then asserts the control signals EN1, EN2, EN3 on lines 212, 222, 232 respectively. The various states of control signals EN1, EN2, EN3 as functions of control signals S0, S1 are shown below in TABLE 1.

TABLE 1

| S0 | S1 | EN1 = /S0 × /S1 | EN2 = /S0 × S1 | EN3 = S0 |
|---|---|---|---|---|
| LOW | LOW | HIGH | LOW | LOW |
| LOW | HIGH | LOW | HIGH | LOW |
| HIGH | LOW | LOW | LOW | HIGH |
| HIGH | HIGH | LOW | LOW | HIGH |

Each of the control signals EN1, EN2, EN3 is respectively asserted at HIGH state when the other two (EN2, EN3), (EN1, EN3), (EN1, EN2) respectively are asserted at LOW state. It is noted that there is no means for simultaneously asserting the LOW states of all three control signals EN1, EN2, EN3 in this second embodiment of controller 260. However, this embodiment of the controller 260 requires fewer pads and is believed typically to occupy less space on the IC chip 290 than the first embodiment of the controller 260 shown in FIG. 3D.

Referring now also to FIG. 3F, there is shown a third embodiment of controller 260 comprising a plurality of pads 264, 265 coupled to a plurality of comparing gates 267, 268, 269 in accordance with the present invention. Comparing gate 267 comprises a NOR gate, and is illustrated in the form of an AND gate modified to invert signals at both input terminals. Comparing gates 268, 269 each comprise an AND gate modified to invert signals at one input terminal. Control signals S1, S0 from an off-chip source are respectively asserted via pads 264, 265 to the comparing gates 267, 268, 269, which decode the control signals S1, S0 according to the relationships EN1=/S0×/S1, EN2=/S0×S1, EN3=S0×/S1, and then assert the control signals EN1, EN2, EN3 on lines 212, 222, 232. The various states of control signals EN1, EN2, EN3 as functions of control signals S0, S1 are shown below in TABLE 2.

TABLE 2

| S0 | S1 | EN1 = /S0 × /S1 | EN2 = /S0 × S1 | EN3 = S0 × /S1 |
|---|---|---|---|---|
| LOW | LOW | HIGH | LOW | LOW |
| LOW | HIGH | LOW | HIGH | LOW |
| HIGH | LOW | LOW | LOW | HIGH |
| HIGH | HIGH | LOW | LOW | LOW |

Each of control signals EN1, EN2, EN3 can be asserted at HIGH state when the other two control signals (EN2, EN3), (EN1, EN3), (EN1, EN2) are at LOW state. Further, all three control signals EN1, EN2, EN3 can be simultaneously asserted at LOW state to support initialization and scanning of the BIST unit 230, logic block 220, or other circuitry on the IC chip 290. This third embodiment of the controller 260 beneficially requires fewer pads and is believed typically to occupy less space on the IC chip 290 than the first embodiment of the controller 260 shown in FIG. 3D. It beneficially supports initialization and scanning when control signals EN1, EN2, EN3 are all at LOW state.

Figure 3G:
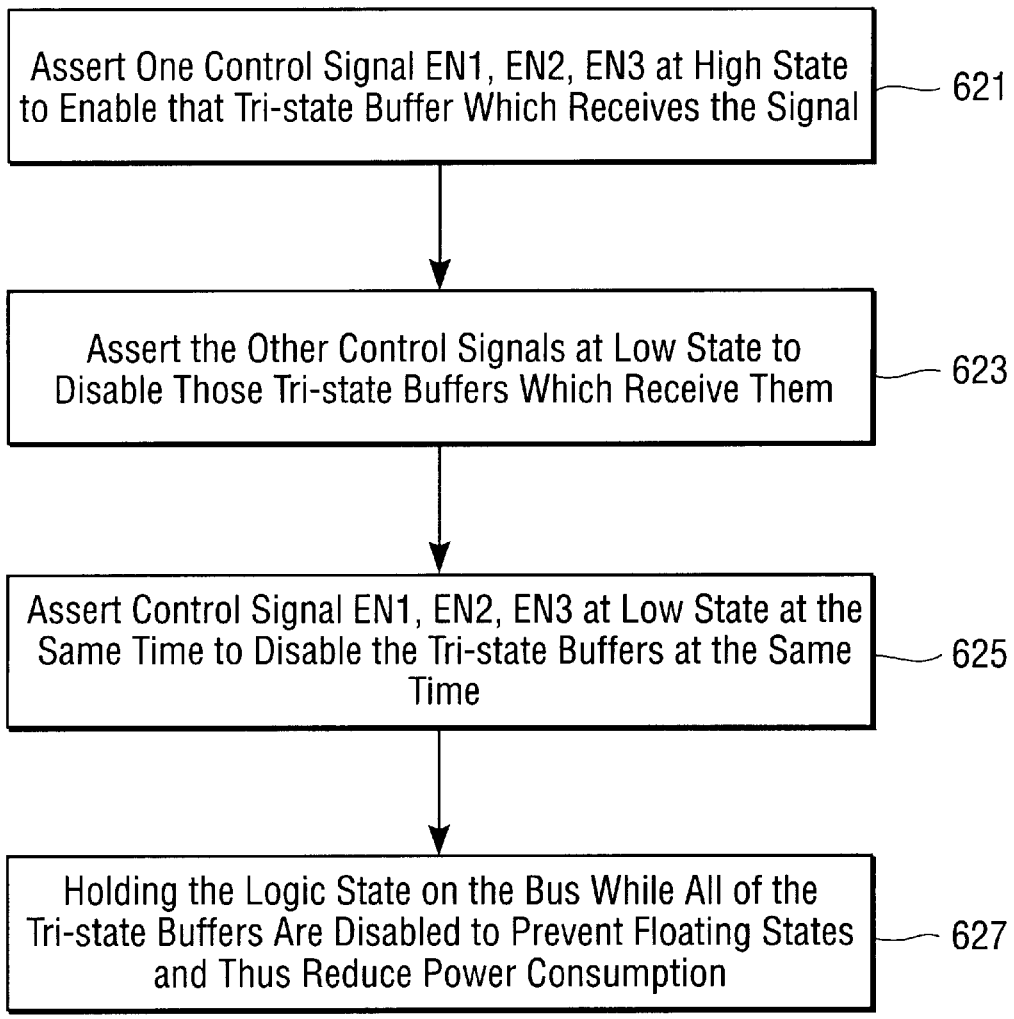
FIG. 3G is a second flow chart illustrating an alternative embodiment of the improved routing method according to the present invention implemented on the first embodiment of the improved routing system, wherein the controller of the improved routing system has the form illustrated in FIG. 3F.

Referring now to FIG. 3G there is shown a second flow chart illustrating an alternative embodiment of the improved routing method according to the present invention implemented on the improved routing system 300. For this embodiment of the improved routing method, the controller 260 of improved routing system 300 has the form illustrated in FIG. 3F. In operation, one of control signals EN1, EN2, EN3 is asserted 621 at HIGH state to enable that tri-state buffer 211, 221, 231 which receives the signal, and the other two control signals (EN2, EN3), (EN1, EN3), or (EN1, EN2) are asserted 623 at LOW state to disable those tri-state buffers which receive them. Controller 260 can assert control signals EN1, EN2, EN3 at LOW state at the same time 625 to disable the tri-state buffers 211, 221, 231. This supports scanning and initialization of the IC chip 290. Bus hold cell 244 can be included in improved routing system 300 to hold 627 current logic states on bus 270 while the control signals EN1, EN2, EN3 are at LOW state. This prevents floating states from arising on the bus 270 while the tri-state buffers 211, 221, 231 are disabled, and thus reduces power consumption on the IC chip 290.

Figure 4A:
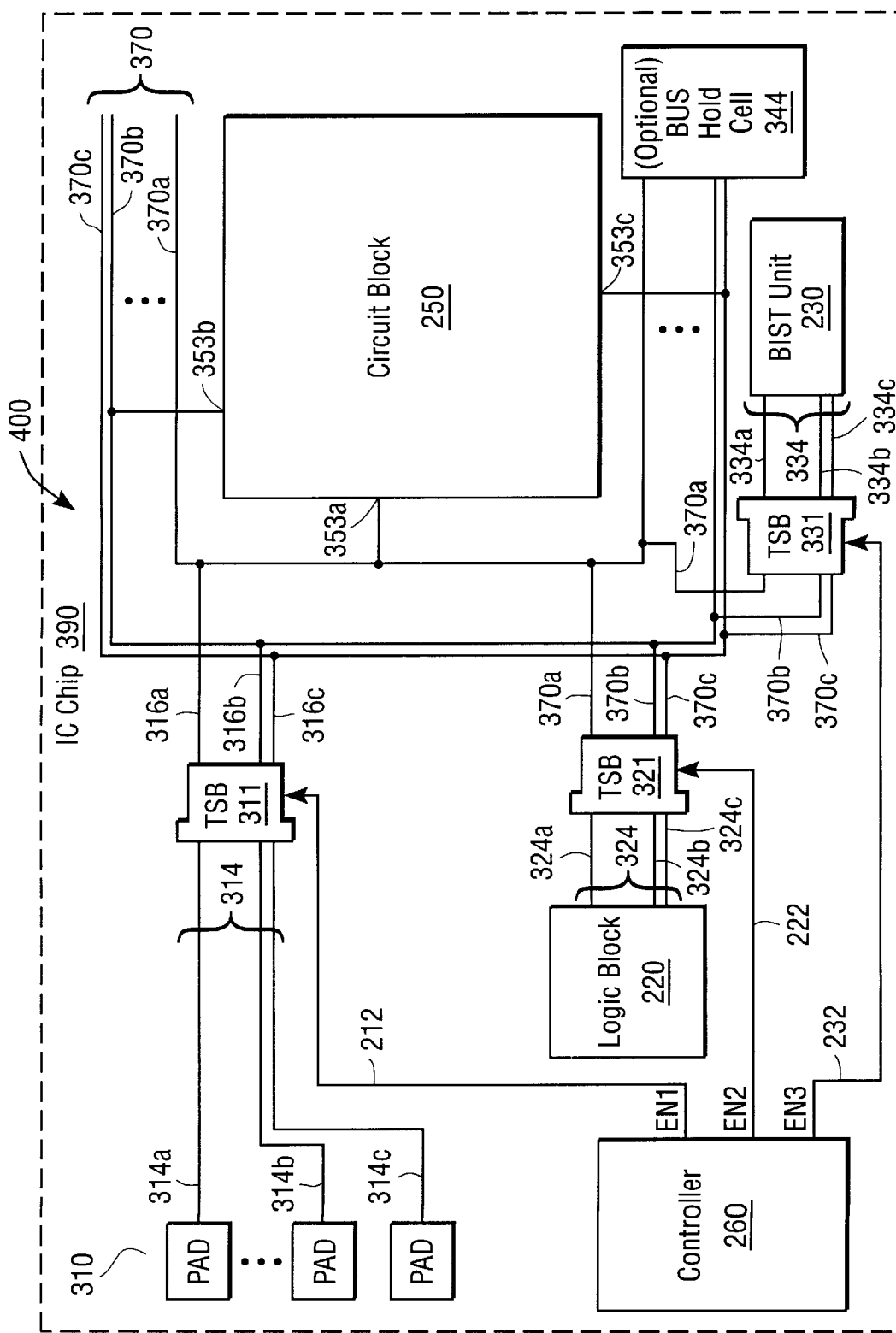
FIG. 4A is a block diagram illustrating a second embodiment of an improved routing system, in accordance with the present invention, for interconnecting numerous electrical devices to terminals of various width.

Referring now to FIG. 4A there is shown a block diagram illustrating a second embodiment of improved routing system 400 for coupling numerous electrical devices to numerous terminals of a circuit block 250 located on an IC chip 390 in accordance with the present invention. The IC chip 390 includes a logic block 220, BIST unit 230, and circuit block 250 as in FIG. 3A. For example, the logic block 220 may be a conventional processing unit, the circuit block 250 may be a large embedded DRAM unit, and BIST unit 230 may be of conventional design for testing such embedded DRAM unit.

In improved routing system 400, the circuit block 250 has a plurality of terminals 353a, 353b, 353c located one a plurality of edges of the circuit block 250. In particular, terminal 353a is located on the left edge of the circuit block 250, terminal 353b is located on the top edge of the circuit block 250, and terminal 353c is located on the bottom edge of the circuit block 250. Additional terminals can be included between the terminals 353a, 353b, 353c. The logic block 220 and BIST unit 230 also have a plurality of terminals, each coupled to a distinct conductive line 324a, 324b, 324c, 334a, 334b, 334c. To improve the clarity of the illustration, these terminals are identified herein by the lines to which they are coupled. Improved routing system 400 uses a plurality of pads 310, but does not require the multiplexors 40, 140 of conventional routing systems 100 and 200.

Improved routing system 400 comprises a plurality of tri-state buffers 311, 321, 331, a controller 260, conductive lines 212, 222, 232, 314, 324, 334, and a bus 370. Tri-state buffers 311, 321, 331 each have a plurality of input terminals, a plurality of output terminals, and an enabling terminal. Specifically, each tri-state buffer 311, 321, 331 is n-bits wide, with n being an integer greater than one. Each input terminal corresponds to one of the output terminals and vice versa. The enabling terminals are used to selectively enable the tri-state buffers 311, 321, 331. When a tri-state buffer is enabled, signals asserted on its input terminals are transmitted through to its output terminals. However, when a ti-state buffer 311, 321, 331 is disabled, signals asserted on the input terminals are not transmitted through to the output terminals. Rather, when disabled, each tri-state buffer 311, 321, 331 supplies a high impedance between each input terminal and its corresponding output terminal. When a tri-state buffer 311, 321, 331 is disabled, the voltage level on each of its output terminals floats substantially to any voltage level that is asserted on the output terminal by other circuitry. Control signals are supplied to the enabling terminals to selectively enable the tri-state buffers 311, 321, 331.

In this embodiment of the present invention, the HIGH states of control signals EN1, EN2, EN3 enable tri-state buffers 311, 321, 331 respectively, and the LOW states of control signals EN1, EN2, EN3 disable tri-state buffers 311, 321, 331 respectively. However, it is also in accordance with the present invention to use different signal states for selectively enabling the tri-state buffers 311, 321, 331. For example, in an alternative embodiment of the present invention, the LOW states of control signals EN1, EN2, EN3 enable tri-state buffers 311, 321, 331 respectively, and the HIGH states of control signals EN1, EN2, EN3 disable the tri-state buffers 311, 321, 331 respectively. The controller 260 supplies control signals EN1, EN2, EN3 for selectively enabling the tri-state buffers 311, 321, 331, as in improved routing system 300. The controller 260 can have a variety of forms including any of the forms shown in FIGS. 3D, 3E, and 3F.

Conductive lines 212, 222, 232 are one-bit wide. Conductive lines 314, 324, 334 and bus 370 are each n-bits wide. Conductive line 314 includes single-bit wide conductive lines 314a, 314b, 314c. Conductive line 324 includes single-bit wide conductive lines 324a, 324b, 324c. Conductive line 334 includes single-bit wide conductive lines 334a, 334b, 334c. Finally, the bus 370 includes single-bit wide buses 370a, 370b, 370c. Additional single-bit wide conductive lines and buses can also be included as shown by ellipsis in FIG. 4A.

The pads 310, logic block 220, and BIST unit 230 are coupled to the circuit block 250 as follows. Pads 310 are coupled by conductive line 314 to the input terminals of tri-state buffer 311. The controller 260 is coupled by conductive line 212 to the enabling terminal of tri-state buffer 311. The output terminals of tri-state buffer 311 are coupled by bus 370 to terminals 353a, 353b, 353c of circuit block 250. The logic block 220 is coupled by conductive line 324 to the input terminals of tri-state buffer 321. The controller 260 is coupled by conductive line 222 to the enabling terminal of tri-state buffer 321. The output terminals of tri-state buffer 321 are coupled by the bus 370 to terminals 353a, 353b, 353c of the circuit block 250. Similarly, the BIST unit 230 is coupled by conductive line 334 to the input terminals of tri-state buffer 331, and the controller 260 is coupled by conductive line 232 to the enabling terminal of tri-state buffer 331. The output terminals of tri-state buffer 331 are coupled by the bus 370 to terminals 353a, 353b, 353c of the circuit block 250.

The plurality of tri-state buffers 311, 321, 331, controller 260, and bus 370 are located on the IC chip 390 as follows. The tri-state buffers 311, 321, 331 are located along a plurality of edges of circuit block 250. In particular, tri-state buffers 311, 321 are located on the left edge of the circuit block 250 and tri-state buffer 331 is located on the bottom edge of the circuit block 250. A routing channel is provided between the circuit block 250 and the tri-state buffers 311, 321, 331 for routing of interconnection media such as the bus 370. In this embodiment of the present invention, the routing channel is preferably just sufficiently wide to hold the bus 370. In alternative embodiments of the present invention, it is preferable for the routing channel to be wide enough to hold other desired interconnection media such as an optional bus hold cell 344, additional buffers which support bidirectional signal flow, and additional conductive lines or buses. The bus 370 preferably is juxtaposed between the tri-state buffers 311, 321, 331 and the circuit block 250 to reduce die area occupied by routing.

Conductive lines 212, 222, 232 allow the controller 260 to be located away from the tri-state buffers 311, 321, 331. Similarly, conductive lines 314, 324, 334 respectively allow pads 310, logic block 220, and BIST unit 230 to be located away from the tri-state buffers 311, 321, 331. Unlike convention routing systems, these conductive lines 212, 222, 232, 314, 324, 334 typically do not increase routing congestion in the vicinity of the circuit block 250.

In improved routing system 400, the single bit wide buses 370a, 370b, 370c of the multi-bit bus 370 are preferably parallel to one another. For example, at the output terminals of tri-state buffer 311, portions 316a, 316b, 316c of buses 370a, 370b, 370c are parallel to one another. Other portions of these buses 370a, 370b, 370c are in parallel to the edges of the circuit block 250 in the vicinity of terminals 353a, 353b, 353c. Each single bit wide bus 370a, 370b, 370c includes a projection which is coupled respectively to one of the terminals 353a, 353b, 353c of the circuit block 250. These properties reduce die area occupied by routing, and substantially eliminate routing congestion in the vicinity of the circuit block 250.

Improved routing system 400 operates in a similar manner as improved routing system 300. The controller 260 enables one of the tri-state buffer 311, 321, 331 at a time. This allows one of the devices 210, 220, or 230 to supply signals to the terminals 353a, 353b, 353c of the circuit block 250 at a time. It is noted, however, that each device 210, 220, 230 can supply signals to all of these terminals 353a, 353b, 353c at the same time. For example, if the controller 260 supplies control signal EN2 at HIGH state, tri-state buffer 321 is enabled. The logic block 220 can then supply signals via conductive lines 324a, 324b, 324c, tri-state buffer 321, and single-bit wide buses 370a, 370b, 370c to terminals 353a, 353b, 353c respectively. To prevent the pads 310 and BIST unit 230 from supplying signals to the terminals 353a, 353b, 353c while the logic block 220 is supplying signals to the terminals 353a, 353b, 353c, the controller 260 supplies control signals EN1 and EN3 at LOW states to disable tri-state buffers 311 and 331 while tri-state buffer 321 is enabled. Similarly, the pads 310 can supply signals to the terminals 353a, 353b, 353c of the circuit block 250 if ti-state buffer 311 is enabled, with signal contention being avoided by disabling tri-state buffer 321 and 331; and the BIST unit 230 can supply signals to the terminals 353a, 353b, 353c of the circuit block 250 if the tri-state buffer 331 is enabled, with signal contention being avoided by disabling tri-state buffer 311 and 321.

The optional multi-bit bus hold cell 344 may be included in a conventional manner to hold the bus 370 to its previous logic states, for example, to support scanning and initialization of the IC chip 290. A suitable multi-bit bus hold cell 344 may be formed in a conventional manner by parallel coupling of a plurality of the single bit bus hold cells 244.

Figure 4B:
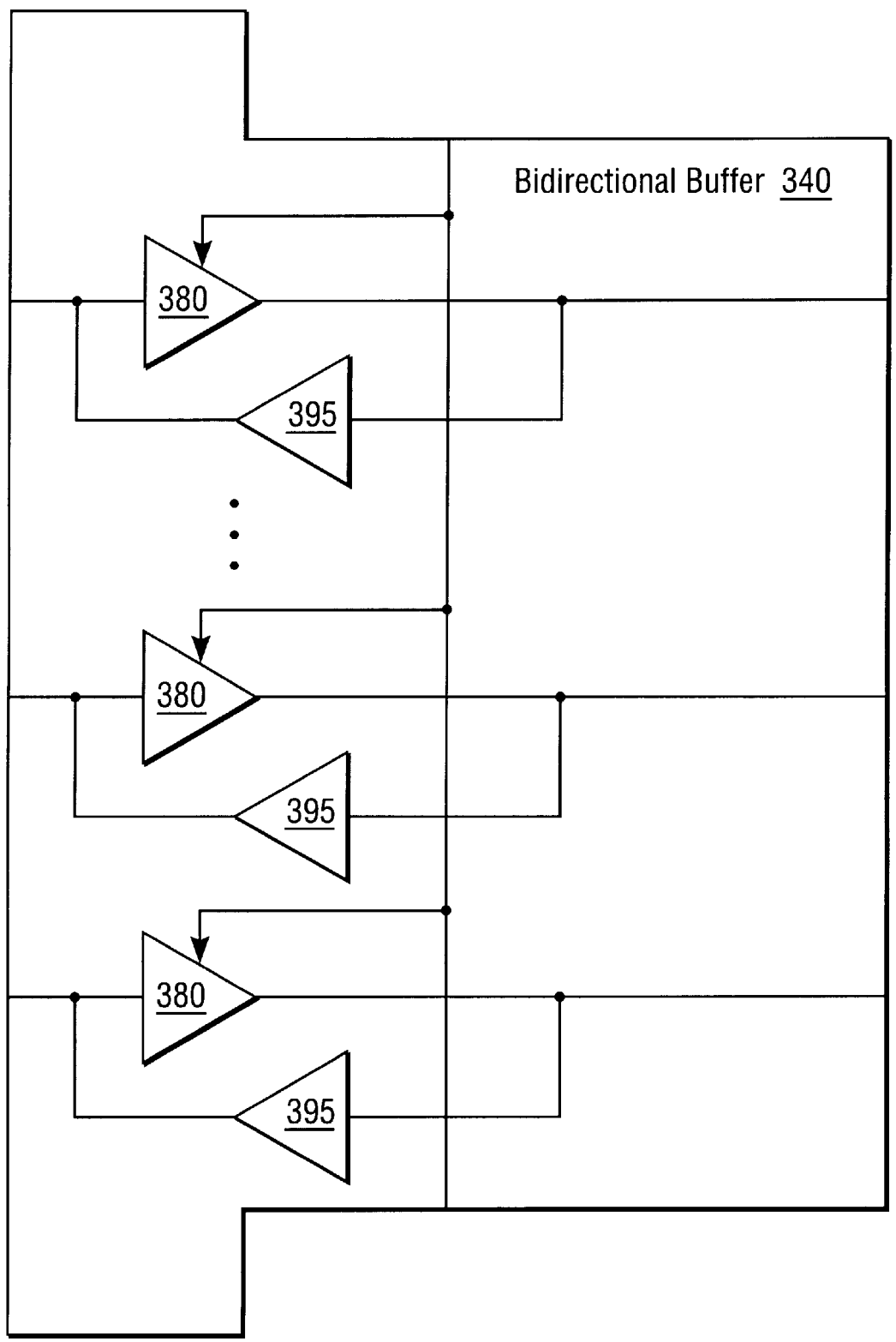
FIG. 4B is a block diagram of an embodiment of a multi-bit bi-directional buffer suitable for use with the present invention.

Referring now to FIG. 4B, there is shown a block diagram of an embodiment of a multi-bit bidirectional buffer 340 suitable for use as tri-state buffers 311, 321, or 331. Bidirectional buffer 340 includes a plurality of single bit tri-state buffers 380, and a plurality of buffers 395. Each of the tri-state buffers 380 is coupled oppositely to a corresponding one of the buffers 395 in the manner described with respect to FIG. 3C. The tri-state buffers 380 are oriented to receive signals from a device and supply signals to a shared conductive line, bus, or other node. The buffers 395 are oriented to receive signals for such device. The enabling terminals of the tri-state buffers 380 are coupled together, and can thus all be selectively enabled using a single control signal.

Where buffers 395 are included with tri-state buffers 311, 321, 331, the buffers 395 receive signals respectively for the pads 310, logic block 220, and BIST unit 230, and the bus 370 is bidirectional. This allows the circuit block 250 to supply signals to the pads 310, logic block 220, and BIST unit 230. Further control of the circuit block 250 can be included to prevent it from asserting signals to the bus 370 while one of tri-state buffers 311, 321, 331 is enabled, for example, in the manner shown in FIG. 5.

In an alternative embodiment of the present invention, the pads 310, logic block 320, and BIST unit 330 are coupled by tri-state buffers 311, 321, 331 and a dedicated set of lines to the circuit block 250 to allow the pads 310, logic block 320, and BIST unit 330 to send signals to the circuit block 250. In another alternative embodiment of the present invention, the circuit block 250 is coupled by another dedicated set of lines and buffers 395 to the pads 310, logic block 320, and BIST unit 330 to allow the pads 310, logic block 320, and BIST unit 330 to receive signals from the circuit block 250. These two alternative embodiments can be used together to provide a dedicated input path and a dedicated output path to the circuit block 250.

Figure 5:
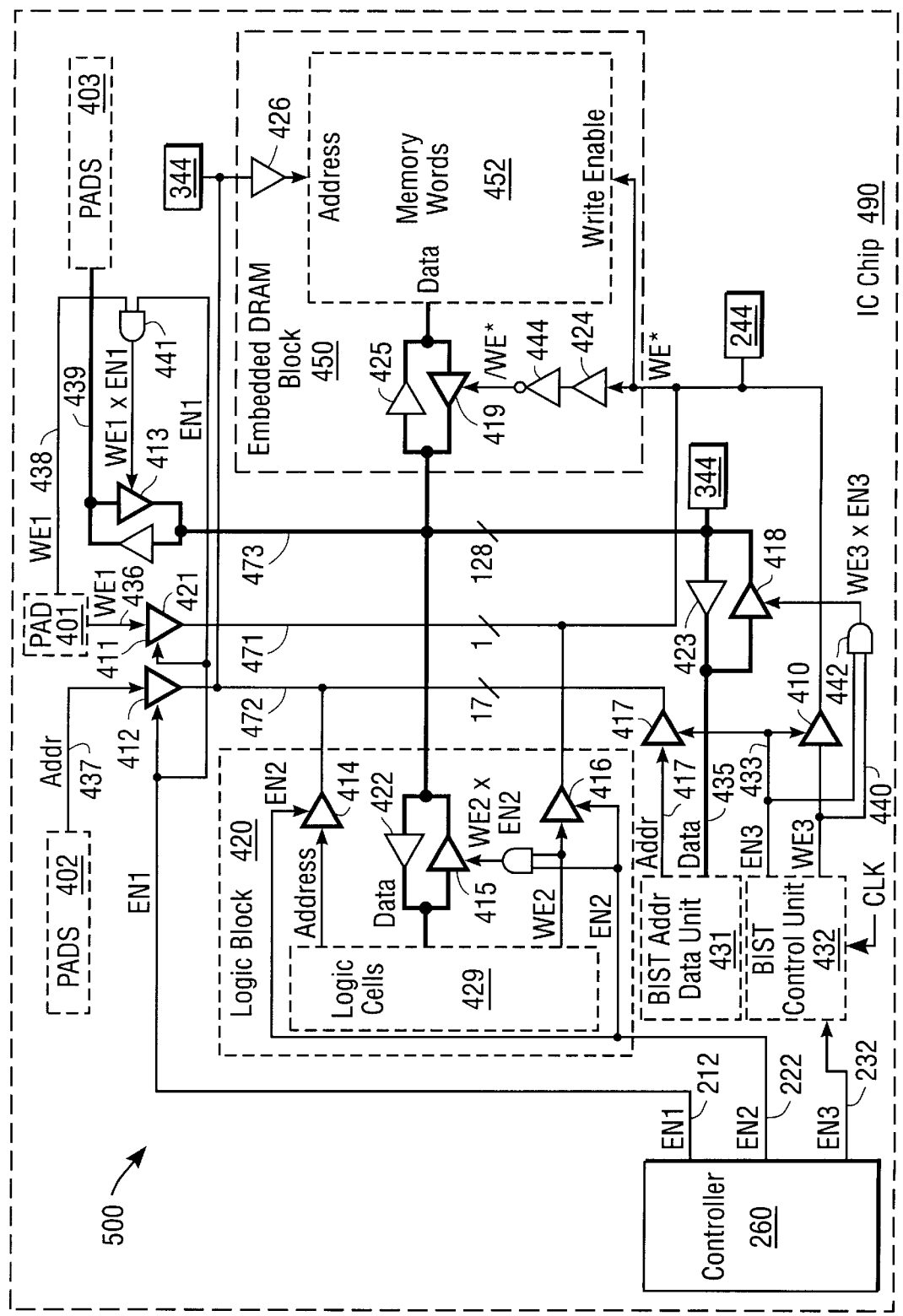
FIG. 5 is an alternative embodiment of improved routing system 500 which allows multiple sources to access and control a bidirectional data bus terminating on an embedded DRAM block.

Referring now to FIG. 5, there is shown an alternative embodiment of an improved routing system 500 for routing signals from various devices both on and off IC chip 490 to an embedded DRAM block 450 in accordance with the present invention. Improved routing system 500 comprises a controller 260, tri-state buffers 410–419, buffers 421–425, AND gates 441–443, inverter 444, conductive lines 212, 222, 232, 433–440, a control bus 471, an address bus 472, and a data bus 473. These components are located on an IC chip 490 and operate in conjunction with a logic block 420, a BIST Address and Data Unit 431, a BIST Control Unit 432, an embedded DRAM block 450, a pad 401, and pluralities of pads 402, 403, in accordance with the present invention.

In this embodiment of the present invention, tri-state buffers 411–419 and buffers 421–425 each support unidirectional signal flow. Where desired, a tri-state buffer and buffer are coupled together in opposite directions to support bidirectional signal flow for a device, with the tri-state buffer supporting signal flow from the device, and the buffer supporting signal flow to the device. Tri-state buffers 410, 411, 416, buffer 424, conductive lines 212, 222, 232, 433, 436, 438, 440, and control bus 471 are each 1-bit wide. Tri-state buffers 412, 414, 417, buffer 426, conductive lines 434, and the address bus 472 are each 17-bits wide, and tri-state buffer 413, 415, 418, 419, buffers 421, 422, 423, 425, conductive lines 435, 439 and the data bus 473 are each 128-bits wide. In this embodiment of the present invention, some of the tri-state buffers and buffers are included in the embedded DRAM block 450 and logic block 420, as next discussed in further detail.

The embedded DRAM block 450 comprises a plurality of memory is words 452 each having a distinct 17-bit address. Each memory word 452 includes 128 memory cells, each capable of storing a single bit of data, yielding a total data storage capacity of 128-bits of data per memory word 452. The total data storage capacity of the embedded DRAM block 450 is two-megabytes. The embedded DRAM block 450 also includes tri-state buffer 419, buffers 424–426, and inverter 444.

In this embodiment of the present invention, terminals are included at the top, left, and bottom edges of the embedded DRAM block 450. In particular, the input terminal of buffer 426 is located at the top edge, the output terminal of buffer 425 and input terminal of tri-state buffer 419 are located at the left edge, and the input terminal of buffer 424 is located at the bottom edge.

The control bus 471 is located along the left and bottom edges of the embedded DRAM block 450. The address bus is located along the left and top edges of the embedded DRAM block 450. The data bus 473 is located along the left edge of the embedded DRAM block 450. It is also in accordance with the present invention to locate these buses 471, 472, 473 along other or additional edges of the embedded DRAM block 450. Each bus 471, 472, 473 preferably is located along at least that edge or edges of the embedded DRAM block 450 which includes a terminal to which it is coupled. The buses 471, 472 and may also be located along other edges of the embedded DRAM block 450 to facilitate connection with other devices, such as pads 401–403, logic block 420, BIST address and data unit 431 and BIST control unit 432. The control, address, and data buses 471, 472, 473, preferably are routed through a routing channel which is as narrow as possible. These buses preferably are juxtaposed between the tri-state buffers 410–419 and the embedded DRAM block 450 to reduce die area occupied by routing.

The input terminal of buffer 426 is coupled to the address bus 472 to receive addresses of desired data, and the output terminal of buffer 426 is coupled to memory words 452 to access such data. Tri-state buffer 419 and buffer 425 are coupled in opposite directions to the memory words 452 and data bus 473. Specifically, tri-state buffer 419 is coupled to receive data from the memory words 452, and if enabled, supply such data to the data bus 473. This supports memory read operations. Buffer 425 is coupled to receive data from the data bus 473 and supply the received data to the memory words 452. This supports memory write operations. Finally, buffer 424 is coupled to the control bus 471 to receive control signal WE*. Buffer 424 is further coupled by inverter 444 to the enabling terminal of tri-state buffer 419, and supplies inverted control signal /WE* thereto to selectively enable the tri-state buffer 419.

To write data to a memory word 452 in the embedded DRAM block 450, the address of the memory word 452 is supplied to the input terminal of buffer 426, the data to be written is supplied to the input terminal of buffer 425, and control signal WE* is supplied at HIGH state to the input terminal of buffer 424. The embedded DRAM block 450 then accesses the memory word 452 having the received address. Such accessing may require conventional strobing of the memory cells 452. By operation of inverter 444, the enabling terminal of tri-state buffer 419 receives inverted control signal /WE* at LOW state. This disables tri-state buffer 419 to allow the data to be supplied via buffer 425 to the accessed memory word 452 without encountering signal contention from tri-state buffer 419.

To read a memory word 452 in the embedded DRAM block 450, the address for the memory word 452 is supplied to the input terminal of buffer 426, and control signal WE* is supplied at LOW state to the input terminal of buffer 424. The embedded DRAM block 450 then accesses the memory word 452 having the received address. By operation of inverter 444, the enabling terminal of tri-state buffer 419 receives inverted control signal /WE* at HIGH state, thus enabling this tri-state buffer 419. The data from the access memory cell is then supplied at the output terminal of tri-state buffer 419.

The controller 260 may have a variety of designs, including any of those shown in FIGS. 3D–F. The controller 260 supplies control signals EN1, EN2, EN3 which are either at HIGH state or LOW state. Further, the controller assures that only one of the three control signals EN1, EN2, EN3 is at HIGH state at any one time. Preferably, the controller 260 has the structure shown in FIG. 3F to beneficially support initialization and scanning of the BIST Address and Data Unit 431 and the BIST Control Unit 432.

The logic block 420 is located along the left edge of the embedded DRAM block 450 and includes tri-state buffers 414, 415, 416, buffer 422, AND gate 442, and a plurality of logic cells 429. The logic cells 429 are shown discretely grouped in FIG. 5 to clearly illustrate interconnection of elements, but typically may be distributed throughout the logic block 420 in accordance with the present invention. The logic cells 429 are coupled to the input terminals of tri-state buffers 414, 415, 416 and supply address, data, and control signals respectively to tri-state buffer 414, 415, 416. The output terminals of tri-state buffers 414, 415, 416 are coupled respectively to the address, data, and control buses 472, 473, 471. If enabled, tri-state buffer 414 supplies the received address to the address bus 472. Tri-state buffers 415, 416 similarly supply the received data and control signals respectively to the data and control busses 473, 471. The data bus 473 is further coupled by buffer 422 to the logic cells 429, with buffer 422 being oriented in the opposite direction as tri-state buffer 415.

The tri-state buffers 414, 415, 416 are selectively enabled by combined operation of the controller 260 and logic cells 429. Specifically, the controller 260 is coupled by conductive line 212 to the enabling terminals of tri-state buffers 414, 416, and to an input terminal of the AND gate 442. The controller 260 supplies control signal EN2 via the conductive line 212 to the enabling terminals of tri-state buffers 414, 416 and to an input terminal of AND gate 442. The logic cells 429 are coupled to supply control signal WE2 to the input terminal of tri-state buffer 416 and to the other input terminal of the AND gate 442. The output terminal of AND gate 442 is coupled to the enabling terminal of tri-state buffer 415, and thus supplies thereto control signal WE2×EN2, which enables the tri-state buffer 415 when both WE2 and EN2 are at HIGH state.

The logic cells 429 can neither read nor write the embedded DRAM block 450 when control signal EN2 is at LOW state because each tri-state buffer 414, 415, 416 will be disabled. However, the logic cell 429 can receive data from the embedded DRAM block 450, or other device coupled to the data bus 473, via buffer 422 regardless of the state of control signal EN2, because buffer 422 is not tri-stateable in this embodiment of the present invention. When the control signal EN2 is at HIGH state, the logic block can selectively read or write the embedded DRAM block 450 as follows.

To write data to a memory word 452 in the embedded DRAM block 450, the logic cells 429 supply the address of the memory word 452 to tri-state buffer 414, the data to be written to tri-state buffer 415, and control signal WE2 at HIGH state to tri-state buffer 416. The controller 260 supplies control signal EN2 at HIGH state to the enabling terminals of tri-state buffers 414, 416, and thus enables the tri-state buffers 414, 416. By operation of the AND gate 442, the enabling terminal of tri-state buffer 415 receives control signal WE2×EN2 at HIGH state, which enables the tri-state buffer 415. The embedded DRAM block receives the control signal WE2=WE* (at HIGH state), the address, and the data via the control, address, and data buses 471, 472, 473 respectively. The write operation proceeds according to the above described operation of the embedded DRAM block 450. It is noted that by operation of inverter 444, the enabling terminal of tri-state buffer 419 in the embedded DRAM block will receive inverted control signal /WE* at LOW state to prevent tri-state buffer 419 from supplying data onto the data bus while the embedded DRAM block 450 is being written by the logic block 420.

To read a memory word 452, the logic cells 429 supply the address of the memory word 452 to tri-state buffer 414, and control signal WE2 at LOW state to tri-state buffer 416. Control signal EN2 is supplied at HIGH state to the enabling terminals of ti-state buffers 414, 416 to enable these tri-state buffers 414, 416. By operation of the AND gate 442, the enabling terminal of tri-state buffer 415 receives control signal WE2×EN2 at LOW state to disable tri-state buffer 415, and thus allow the data bus 473 to carry data from the memory word 452 without encountering signal contention from tri-state buffer 415. The embedded DRAM block receives the control signal WE2=WE* (at LOW state) and the address via the control and address buses 471, 472 respectively. The read operation proceeds according to the above described operation of the embedded DRAM block 450, and data supplied to the data bus 473 by the embedded DRAM block 450 is then received via buffer 422 at logic cells 429 as desired.

The BIST Address and Data Unit 431, BIST Control Unit 432, tri-state buffers 410, 417, 418, buffer 423, and AND gate 443 are located near the bottom left corner of the embedded DRAM block 450. They can alternatively be located in other locations, such as along the bottom edge of the embedded DRAM block 450. The tri-state buffers 417 and buffer 423, and AND gate 443 may conveniently be located away from the BIST address and data unit 431 and BIST control unit 432, for example, to more efficiently utilize die area.

The BIST Address and Data Unit 431, BIST Control Unit 432, tri-state buffers 410, 417, 418, buffer 423, and AND gate 443 support built in self testing of the embedded DRAM block 450. Such testing may comprise both writing BIST generated test vectors to the embedded DRAM block 450, and reading the embedded DRAM block 450 to determine whether such test vectors or other data have been accurately written and stored therein, and can be accurately read therefrom.

The BIST Address and Data Unit 431 is coupled by conductive line 434 and tri-state buffer 417 to the address bus 472. When tri-state buffer 417 is enabled, the BIST Address and Data Unit 431 can supply addresses via the address bus 472 to the embedded DRAM block 450. This allows the BIST Address and Data Unit 431 to access the embedded DRAM block 450. The BIST Address and Data Unit 431 is further coupled by conductive line 435 and tri-state buffer 418 to the data bus 473. Buffer 423 is also coupled to the conductive line 435 and the data bus 473, but in the opposite direction to tri-state buffer 418, to allow the BIST Address and Data Unit 431 to receive data from the data bus 473. Such received data may be used, for example, to determine whether the embedded DRAM block 452 stores correct values of various test vectors or other data.

Tri-state buffers 410, 417, 418 are coupled with the controller 260 and BIST Control Unit 432, as follows. The controller 260 is coupled by conductive line 232 to the BIST Control Unit 432. The BIST Control Unit 432 is coupled by conductive line 433 to the enabling terminals of tri-state buffers 410 and 417, and to one of the input terminals of AND gate 443. The BIST Control Unit 432 is further coupled by conductive line 440 to the input terminal of tri-state buffer 410 and to the other input terminal of AND gate 443. The output terminal of AND gate 443 is coupled to the enabling terminal of tri-state buffer 418. Finally, the output of tri-state buffer 410 is coupled by the control bus 471 to the input terminal of buffer 424 in the embedded DRAM block 450.

To write a memory word to the embedded DRAM block 450, the controller 260 supplies control signal EN3 at HIGH state to the BIST Control Unit 432. The BIST Control Unit 432 then forwards control signal EN3 at HIGH state via conductive line 433 to the enabling terminals of tri-state buffers 410 and 417, thus enabling them. This allows the BIST Address and Data Unit 431 to supply an address for the memory word 452 via the address bus 472 to buffer 426 in the embedded DRAM block 450. The BIST Control Unit 432 also supplies control signal WE3 at HIGH state. In response thereto, AND gate 443 supplies control signal WE3×EN3 at HIGH state, which enables tri-state buffer 418, and thus allows the BIST Address and Data Unit 431 to supply data via the data bus 473 to buffer 425 in the embedded DRAM block 450. Further, control signal WE*=WE3 is forwarded by enabled tri-state buffer 410 via control bus 471 to the input terminal of buffer 424 in the embedded DRAM block 450. There it is inverted /WE* by inverter 444 to LOW state, and hence disables tri-state buffer 419. This prevents embedded DRAM block 450 from supplying data to the data bus 473 while the BIST Address and Data Unit 431 is supplying data to the data bus 473.

To read a memory word 452 in the embedded DRAM block 450, the controller 260 supplies control signal EN3 at HIGH state to the BIST Control Unit 432. The BIST Control Unit 432 then forwards control signal EN3 at HIGH state to the enabling terminal of tri-state buffer 417. As in the write operation, this allows the BIST Address and Data Unit 431 to supply an address for the memory word 452 via the address bus 472 to the embedded DRAM block 450. Unlike the write operation, the BIST Control Unit 432 supplies control signal WE3 at LOW state. Consequently, the AND gate 443 supplies control signal WE3×EN3 at LOW state to disable tri-state buffer 418, and hence prevent the BIST Address and Data Unit 431 from supplying data to data bus 473 while the embedded DRAM block 450 is being read. Further, the enabling terminal of tri-state buffer 419 in the embedded DRAM block 450 receives inverted signal /WE*=/WE3 at HIGH state, which enables this tri-state buffer 419, and allows the embedded DRAM block 450 to supply data onto the data bus 473. The read operation proceeds as described in the description of operation of the embedded DRAM block 450, with the desired data being supplied to the data bus 473, and received via buffer 423 and conductive line 435 at the BIST Address and Data Unit 431.

It is noted that the BIST Address and Data Unit 431 can write or read the embedded DRAM block 450 when, but only when, control signal EN3 is at HIGH state. However, the BIST Address and Data Unit 431 can receive data from the data bus 473 regardless of the state of control signal EN3 via buffer 423 because, in this embodiment of the present invention, this buffer 423 is not tri-stateable.

Signals from off the IC chip 490 are supplied to the IC chip 490 by pluralities of pads 401, 402, 403. Pads 401, 402, tri-state buffers 411–413, and buffer 421 are located near the top left corner of the embedded DRAM block 450. Pads 403 and AND gate 441 are located along the top edge of the embedded DRAM block 450. Alternatively, pads 401–403, tri-state buffers 411–413, buffer 421, and AND gate 441 may be located in various locations, such as along the top edge of the embedded DRAM block 450. Pad 401 is coupled to receive a control signal WE1 from off the IC chip 490. Pad 401 is further coupled by conductive line 436 and tri-state buffer 411 to the control bus 471, and when tri-state buffer 411 is enabled, supplies the received control signal WE1 to the control bus 471. Pads 402 comprise 17-distinct pads coupled to receive 17-bit addresses for accessing the memory words 452. Pads 402 are further coupled by conductive line 437 and tri-state buffer 412 to the address bus 472, and when tri-state buffer 412 is enabled, supply an address received from off the IC chip 90 to the address bus 472. Finally, pads 403 comprise 128-distinct pads coupled to communicate 128-bit data blocks bidirectionally between off-chip circuitry and on-chip circuitry coupled to the data bus 473. Specifically, the pads 403 are coupled by conductive line 439 and multi-bit tri-state buffer 413 to the data bus 437 to supply such data from off-chip circuitry to such on-chip circuitry. Further, the data bus 473 is further coupled by multi-bit buffer 421 and conductive line 439 to the pads 403 to supply data from such on-chip circuitry to such off-chip devices.

Tri-state buffers 411, 412, 413 are selectively enabled by operation of the controller 260 and pad 401 as follows. The controller 260 is coupled by conductive line 212 to the enabling terminals of tri-state buffers 411, 412, and to an input terminal of the AND gate 441, and supplies control signal EN1 via conductive line 212 to these terminals. Pad 401 receives control signal WE1 from an off-chip source, and supplies the control signal WE1 to both the input terminal of tri-state buffer 411 and the other input terminal of AND gate 441. The output terminal of AND gate 441 is coupled to the enabling terminal of tri-state buffer 413, and thus supplies thereto control signal WE1×EN1 to selectively enable the tri-state buffer 413.

It is noted that the pads 401–403 are coupled to the various buses 471–473 in essentially the same manner as the logic cells 429, except that the tri-state buffers 411–413 are selectively enabled in response to signals EN1 and WE1, rather than signals EN2 and WE2. The pads 401–403 can neither read nor write the embedded DRAM block 450 when control signal EN1 is at LOW state. But, when control signal EN1 is at HIGH state, the embedded DRAM block 450 can be read by the pads 401–401, and hence from off-chip, by supplying control signal WE1 at LOW state, and similarly can be written by pads 401–403, and hence from off-chip, by supplying control signal WE1 at HIGH state.

It has been shown that the controller 260 prevents signal contention between the embedded DRAM block 450 and various devices thereto, i.e. pads 401–403, logic block 420, BIST Address and Data Unit 431, BIST Control Unit 432, and various tri-state buffers. Further though, the controller 260 also prevents signal contention arising between such devices by supplying only one of the three control signals EN1, EN2, EN3 at HIGH state at any one time. For example, the logic block 420 can access the embedded DRAM block 452 when control signal EN2 is at HIGH state. When the controller 260 supplies control signal EN2 at HIGH state, it simultaneously supplies control signals EN1, EN3 at LOW state. This prevents the pads 401–403, BIST Address and Data Unit 431, BIST Control Unit 432, and the tri-state buffers coupled therewith, from supplying any signals to the various busses 471–473 while the logic block 420 may be using the busses 471–473, and thus prevents signal contention between the various devices. The controller 260 similarly prevents signal contention between the various devices when control signal EN 1 (EN3) is at HIGH state by supplying control signals EN2, EN3 (EN1, EN2) at LOW state.

Finally, optional bus hold cells 244, 344 are preferably included in improved routing system 500, with bus hold cell 244 coupled to the control bus 471, and a distinct multi-bit bus hold cell 344 coupled to each of the address bus 472 and the data bus 473. The bus hold cells 244, 344 save power by preventing floating states on the buses 471–473, and thus support efficient initialization and scanning of the IC chip 490.

There are thus presented an improved routing system and method for routing pluralities of signals to one or more circuit blocks on an IC chip while avoiding contention between such signals in accordance with the present invention. In one embodiment of the present invention, a single terminal of a circuit block is routed to receive signals from a plurality of devices. The improved routing method prevents contention between the signals from these devices by allowing only one of the devices to supply a signal to the terminal at a time. A plurality of tri-state buffers are beneficially used to selectively place outputs of the other devices at high impedance with respect to the terminal of the circuit block. A bus can also be used with this embodiment of the present invention to reduce the space used for routing signals from the tri-state buffer to the terminal of the circuit block. In alternative embodiments of the improved routing system, a circuit block includes a plurality of terminals, each of which receives a plurality of signals from various devices, in accordance with the present invention. Contention between such signals is avoided using a plurality of tri-state buffers enabled one at a time. Such tri-state buffers can have multi-bit input terminals and multi-bit output terminals. Some embodiments of the present invention use a multi-bit bus comprising a plurality of single bit lines disposed in parallel along one or more edges of the circuit block. The multi-bit bus is believed to greatly reduce routing congestion in the vicinity of the circuit block.

While the present invention has been described with respect to certain preferred embodiments, those skilled in the art will recognize that various modifications may be provided. For example, in some alternative embodiments of the present invention include tri-state buffers that invert signals received at input. Thus, a LOW signal (HIGH signal) at the input terminal of such a tri-state buffer would yield either a HIGH signal (LOW signal) or high impedance at the output terminal of such tri-state buffer. These and other variations upon and modifications to the preferred embodiments are provided by the present invention, which is limited only by the following claims.

What is claimed is:

1. A system for selectively routing signals from a plurality of devices on an integrated circuit chip to a plurality of terminals of a circuit block on the integrated circuit chip, said system comprising:
a controller configured to dynamically supply a plurality of control signals during circuit block operation; and
a plurality of tri-state buffers distributed along a plurality of edges of the circuit block, each tri-state buffer having an input coupled to receive an input signal from said one of the devices, an enabling terminal coupled to receive one of the control signals, and an output coupled to one of the terminals of the circuit block for selectively supplying thereto, responsive to the control signal, one of the received input signal and a high impedance level;
wherein the controller further comprises at least one pad for receiving at least one additional signal from off said integrated circuit chip, with the controller determining appropriate values for control signals supplied to the tri-state buffers in response to said at least one additional signal.

2. The system of claim 1, further comprising a bus coupled to supply received input signals from the outputs of the tri-state buffers to the terminals of the circuit block, with the bus juxtaposed between the tri-state buffers and the circuit block to reduce die area occupied by routing.

3. The system of claim 1, wherein the controller supplies at least one of the control signals at HIGH and LOW states to selectively enable at least one of the tri-state buffers.

4. The system of claim 1, further comprising the circuit block, with die area occupied by said circuit block dedicated thereto.

5. The system of claim 1, further comprising the circuit block, with said circuit block being a dynamic random access memory unit having at least one megabyte data storage capacity and a large number of terminals, with die area occupied by said dynamic random access memory unit being dedicated thereto, and with the tri-state buffers located adjacent the terminals of the dynamic random access memory unit to efficiently utilize remaining die area on the integrated circuit chip.

6. The system of claim 1, wherein at least one of the tri-state buffers is located in at least one of the devices to save routing space between the circuit block and said at least one of the devices.

7. The system of claim 1, further comprising a plurality of buffers coupled to supply signals from at least one of the devices to at least one other of the devices.

8. The system of claim 1, further comprising a plurality of additional buffers coupled to supply signals from the circuit block to at least one of the devices.

9. The system of claim 1, further comprising at least one additional tri-state buffer selectively enabled by the controller and coupled to supply signals from the circuit block to at least one of the devices when enabled.

10. The system of claim 9, wherein said at least one additional tri-state buffer is located in the circuit block to save routing space between the circuit block and the plurality of devices.

11. The system of claim 1, further comprising:
a first bus coupled to carry received input signals from the outputs of the tri-state buffers to the terminals of the circuit block; and
a second bus coupled to carry output signals from the circuit block to at least one of the devices.

12. The system of claim 11, wherein the first and second bus are juxtaposed between the tri-state buffers and the circuit block to reduce die area occupied by routing.

13. The system of claim 11, wherein the second bus further comprises at least one additional buffer for buffering the output signals for said at least one of the devices.

14. The system of claim 11, wherein the first and second bus are dedicated to unidirectional signal flow.

15. The system of claim 1, wherein at least one of the terminals of the circuit block can both receive and supply signals, and further comprising at least one additional tri-state buffer coupled to supply output signals from said at least one of the terminals to at least one of the devices, said at least one additional tri-state buffer selectively enabled by the controller.

16. The system of claim 15, further comprising a bidirectional bus coupled to carry both the input and the output signals.

17. The system of claim 16, wherein the bidirectional bus is juxtaposed between the tri-state buffers and the circuit block to reduce die area occupied by routing.

18. The system of claim 16, further comprising a bidirectional bus coupled to carry signals from the outputs of the tri-state buffers to the terminals of the circuit block, and further coupled to carry signals from the terminals of the circuit block to at least one of the devices.

19. The system of claim 1, further comprising:
    a bidirectional bus coupled to carry signals from the outputs of the tri-state buffers to the terminals of the circuit block, and coupled to receive signals from the circuit block; and
    at least one additional buffer coupled to supply signals on the bidirectional bus to at least one of the devices.

20. The system of claim 1, further comprising a multi-bit bus coupled to carry signals from outputs of the tri-state buffers to the terminals of the circuit block, said multi-bit bus having a plurality of single bit conductive lines oriented in parallel to one another to reduce die area occupied by routing.

21. The system of claim 20, wherein multi-bit bus is juxtaposed between the tri-state buffers and the circuit block to reduce die area occupied by routing.

22. The system of claim 1, wherein a subset of the tri-state buffers are grouped to supply multi-bit input signals to the terminals of the circuit block.

23. The system of claim 22, wherein the subset of tri-state buffers supplies a multi-bit input signal along a plurality of parallel disposed signal paths to the terminals of the circuit block.

24. The system of claim 1, further comprising at least one conductive line coupling the controller to at least one of the tri-state buffers to allow the controller to be located away from said at least one of the tri-state buffers.

25. The system of claim 1, further comprising at least one additional buffer having an input coupled to the output of one of the tri-state buffers and having an output coupled to the input of said one of the tri-state buffers to form a bidirectional buffer.

26. The system of claim 25, wherein at least one of said at least one additional buffer cannot be tri-stated.

27. The system of claim 1, wherein the controller enables only one of the tri-state buffers at a time to prevent signal contention.

28. The system of claim 1, further comprising at least one pad coupled to supply at least one of the input signals to at least one of the tri-state buffers to allow the terminals of the circuit block to receive signals from circuitry located off said integrated circuit chip.

29. A system for selectively routing signals from a plurality of devices on an integrated circuit chip to a plurality of terminals of a circuit block on the integrated circuit chip, said system comprising:
    a controller configured to dynamically supply a plurality of control signals during circuit block operation; and
    a plurality of tri-state buffers distributed along a plurality of edges of the circuit block, each tri-state buffer having an input coupled to receive an input signal from said one of the devices, an enabling terminal coupled to receive one of the control signals, and an output coupled to one of the terminals of the circuit block for selectively supplying thereto, responsive to the control signal, one of the received input signal and a high impedance level;
    wherein the controller further comprises:
        a plurality of pads, each coupled to receive additional signals from off said integrated circuit chip; and
        a plurality of comparing gates, each comparing gate coupled to receive said additional signals from the pads, and in response thereto, to supply one of the control signals.

30. The system of claim 29, wherein the plurality of comparing gates, are further coupled to supply, in response to a particular value of the additional signals, control signals which disable each of the tri-state buffers during a set of initialization operations.

31. A controller for controlling a plurality of tri-state buffers of a signal routing system located on an integrated circuit chip, said controller comprising:
    at least one pad, each pad coupled to receive a corresponding signal from off said integrated circuit chip; and
    a plurality of comparing gates, each coupled to receive the corresponding signals from each of the pads, with each comparing gate supplying a control signal to a corresponding one of the tri-state buffers, for enabling the corresponding tri-state buffer only when each other tri-state buffer of said routing system is tri-stated.

32. A controller for controlling a plurality of tri-state buffers of a signal routing system located on an integrated circuit chip, said controller comprising:
    a first pad coupled to receive a first signal from off said integrated circuit chip;
    a second pad coupled to receive a second signal from off said integrated circuit chip;
    a NOR gate having a first input coupled to the first pad for receiving the first signal, a second input coupled to the second pad for receiving the second signal, and an output coupled to supply a first control signal to an enabling terminal of a first one of the tri-state buffers; and
    a modified AND gate having a first input coupled to the first pad for receiving the first signal, a second input modified to invert signals received thereat coupled to the second pad for receiving the second signal, and an output coupled to supply a second control signal to an enabling terminal of a second one of the tri-state buffers; and
    a second modified AND gate having a first input coupled to the second pad for receiving the second signal, a second input modified to invert signals received thereat coupled to the first pad for receiving the first signal, and an output coupled to supply a third control signal to an enabling terminal of a third one of the tri-state buffers, for selectively enabling one of the first, second, and third tri-state buffers at a time.

33. A method for controlling a plurality of tri-state buffers, each located on an integrated circuit chip and having an input coupled to a device on the integrated circuit chip and an output coupled in common to a terminal of a circuit block on the integrated circuit chip, said method comprising the steps of:

disabling each of the tri-state buffers substantially simultaneously during a set of initialization operations; and holding the outputs of the tri-state buffers during the set of initialization operations at a logic signal level established most recently prior to commencement of the set of initialization operations to reduce power consumption on the integrated circuit chip.

* * * * *